US 11,288,188 B1

(12) United States Patent
Tummala et al.

(10) Patent No.: US 11,288,188 B1
(45) Date of Patent: Mar. 29, 2022

(54) DYNAMIC METADATA RELOCATION IN MEMORY

(71) Applicant: QUALCOMM INCORPORATED, San Diego, CA (US)

(72) Inventors: Gopi Tummala, Sunnyvale, CA (US); Hirai Nandu, South San Francisco, CA (US); Subbarao Palacharla, San Diego, CA (US); Syed Minhaj Hassan, San Diego, CA (US); Sai Ramesh Bhyravajosula, San Diego, CA (US); Anurag Nannaka, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/154,345

(22) Filed: Jan. 21, 2021

(51) Int. Cl.
*G06F 12/06* (2006.01)
*G11C 11/401* (2006.01)

(52) U.S. Cl.
CPC .. *G06F 12/0646* (2013.01); *G06F 2212/1041* (2013.01); *G11C 11/401* (2013.01)

(58) Field of Classification Search
CPC ......... G06F 12/0646; G06F 2212/1041; G11C 11/401
USPC ........................................................ 711/105
See application file for complete search history.

(56) References Cited

U.S. PATENT DOCUMENTS

| 10,747,460 | B2 | 8/2020 | Sun et al. | |
| 2012/0297256 | A1 | 11/2012 | Plondke et al. | |
| 2013/0124778 | A1 | 5/2013 | Arya et al. | |
| 2018/0211046 | A1* | 7/2018 | Muttik | G06F 21/577 |
| 2018/0300086 | A1* | 10/2018 | Han | G06F 3/0685 |
| 2019/0243705 | A1 | 8/2019 | Modave et al. | |
| 2020/0034308 | A1* | 1/2020 | Shveidel | G06F 3/067 |
| 2021/0081372 | A1* | 3/2021 | Lee | G06F 16/284 |
| 2021/0223957 | A1* | 7/2021 | Matsumura | G06F 3/0659 |
| 2021/0357322 | A1* | 11/2021 | Shveidel | G06F 12/0646 |
| 2021/0365384 | A1* | 11/2021 | Goss | G06F 12/1009 |

FOREIGN PATENT DOCUMENTS

| CN | 109976947 | * | 1/2021 |
| CN | 112214805 | * | 1/2021 |

* cited by examiner

*Primary Examiner* — Fernando Hidalgo
(74) *Attorney, Agent, or Firm* — Smith Tempel Blaha LLC/Qualcomm

(57) ABSTRACT

Metadata is dynamically relocated in a DRAM from a virtual page that does not map to the same DRAM row in which the associated data is located, to that same DRAM row. If the target of a data access request is a location in a first page that is configured to store metadata rather than data, then a second location in a second page may be determined, and the requested data may be accessed at the second location. The associated metadata may be accessed at the location in the first page, which is configured in the virtual domain to store data but is configured in the physical domain to store the metadata associated with the data in the first page.

30 Claims, 13 Drawing Sheets

DYNAMIC METADATA RELOCATION IN MEMORY

DESCRIPTION OF THE RELATED ART

A computing device may include multiple subsystems that communicate with one another via buses or other interconnects. Such a computing device may be, for example, a portable computing device ("PCD"), such as a laptop or palmtop computer, a cellular telephone or smartphone, portable digital assistant, portable game console, etc. The communicating subsystems may be included within the same integrated circuit chip or in different chips. A "system-on-a-chip" or "SoC" is an example of one such chip that integrates numerous components to provide system-level functionality. For example, an SoC may include one or more types of processors, such as central processing units ("CPU"s), graphics processing units ("GPU"s), digital signal processors ("DSP"s), and neural processing units ("NPU"s). An SoC may include other subsystems, such as a transceiver or "modem" subsystem that provides wireless connectivity, a memory subsystem, etc. An SoC may be coupled to one or more memory chips via a data communication link. The various processing engines may perform memory transactions with the memory. The main or system memory in PCDs and other computing devices commonly comprises dynamic random access memory ("DRAM"). DRAM is organized in arrays of rows and columns. A row must be opened before its data can be accessed. Only one row may be open at any time. A DRAM row is sometimes referred to as a (physical) page.

The term "conflict" refers to a memory transaction directed to a DRAM row that is closed, while at the same time another row (to which the transaction is not directed) is open. If a memory transaction is a conflict, the open row must first be closed, and then the row to which the transaction is directed must be opened. A conflict increases memory latency, which is the amount of time to complete a memory transaction in response to a processing engine's transaction request. Memory latency has the potential to impact computing device performance, and ultimately, the user experience. Minimizing memory latency may also be a significant objective in mission-critical or safety-critical computing devices, such as those used to control autonomous vehicles, drones, etc.

Some types of data have associated metadata. For example, a "syndrome" is metadata associated with data that is subject to error correction algorithms. Flags and other metadata may be associated with data that is subject to compression algorithms. A signature, hash, etc., may be associated with data that is subject to authentication algorithms. Still other types of metadata are known, such as memory tagging extensions ("MTE"s). Metadata is commonly stored in the memory in a way that it can be accessed when the associated data is accessed.

SUMMARY OF THE DISCLOSURE

Systems, methods, computer-readable media, and other examples are disclosed for metadata relocation in a DRAM. Metadata may be dynamically relocated from a virtual page that does not map to the same DRAM row in which the associated data is located, to that same DRAM row.

An exemplary method for metadata relocation in a DRAM may include receiving a first request to access data at a first data location in a first memory page of the DRAM and associated metadata at a first metadata location in a second memory page of the DRAM. The method may include determining whether the first data location in the first memory page is configured to store metadata. The method may also include accessing the data at the first data location in the first memory page if the first data location in the first memory page is not configured to store metadata. The method may further include determining a metadata location in the first memory page if the first data location in the first memory page is not configured to store metadata. The method may still further include accessing the associated metadata at the metadata location in the first memory page if the first data location in the first memory page is not configured to store metadata. The method may include determining a second data location in the second memory page if the first data location in the first memory page is configured to store metadata. The method may further include accessing the data at the second data location in the second memory page if the first data location in the first memory page is configured to store metadata. The method may yet further include accessing the associated metadata at the first data location in the first memory page if the first data location in the first memory page is configured to store metadata.

An exemplary system for metadata relocation may include a DRAM and a processor. The processor may be configured to receive a first request to access data at a first data location in a first memory page and associated metadata at a first metadata location in a second memory page. The processor may also be configured to determine whether the first data location in the first memory page is configured to store metadata. The processor may further be configured to access the data at the first data location in the first memory page if the first data location in the first memory page is not configured to store metadata. The processor may still further be configured to determine a metadata location in the first memory page if the first data location in the first memory page is not configured to store metadata. The processor may yet further be configured to access the associated metadata at the metadata location in the first memory page if the first data location in the first memory page is not configured to store metadata. The processor may be configured to determine a second data location in the second memory page if the first data location in the first memory page is configured to store metadata. The processor may further be configured to access the data at the second data location in the second memory page if the first data location in the first memory page is configured to store metadata. The processor may yet further be configured to access the associated metadata at the first data location in the first memory page if the first data location in the first memory page is configured to store metadata Another exemplary system for metadata relocation in a DRAM may include means for receiving a first request to access data at a first data location in a first memory page of the DRAM and associated metadata at a first metadata location in a second memory page of the DRAM. The system may include means for determining whether the first data location in the first memory page is configured to store metadata. The system may also include means for accessing the data at the first data location in the first memory page if the first data location in the first memory page is not configured to store metadata. The system may further include means for determining a metadata location in the first memory page if the first data location in the first memory page is not configured to store metadata. The system may still further include means for accessing the associated metadata at the metadata location in the first memory page if the first data location in the first memory page is not configured to store metadata. The system may include means for determining a second data location in the second memory page if the first data location in the first memory page is configured to store metadata. The system may further include means for accessing the data at the second data location in the second memory page if the first data location in the first memory page is configured to store metadata. The system may yet further include means for accessing the associated metadata at the first data location in the first memory page if the first data location in the first memory page is configured to store metadata.

An exemplary computer-readable medium for metadata relocation in a DRAM may comprise a non-transitory computer-readable medium having instructions stored thereon in computer-executable form. The instructions, when executed by a processor, may configure the processor to receive a first request to access data at a first data location in a first memory page and associated metadata in a second memory page. The instructions may configure the processor to determine whether the first data location in the first memory page is configured to store metadata. The instructions may further configure the processor to access the data at the first data location in the first memory page if the first data location in the first memory page is not configured to store metadata. The instructions may yet further configure the processor to determine a metadata location in the first memory page if the first data location in the first memory page is not configured to store metadata. The instructions may still further configure the processor to access the associated metadata at the metadata location in the first memory page if the first data location in the first memory page is not configured to store metadata. The instructions may configure the processor to determine a second data location in the second memory page if the first data location in the first memory page is configured to store metadata. The instructions may further configure the processor to access the data at the second data location in the second memory page if the first data location in the first memory page is configured to store metadata. The instructions may yet further configure the processor to access the associated metadata at the first data location in the first memory page if the first data location in the first memory page is configured to store metadata.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." The word "illustrative" may be used herein synonymously with "exemplary." Any aspect described herein as "exemplary" is not necessarily to be construed as preferred or advantageous over other aspects.

Figure 1:
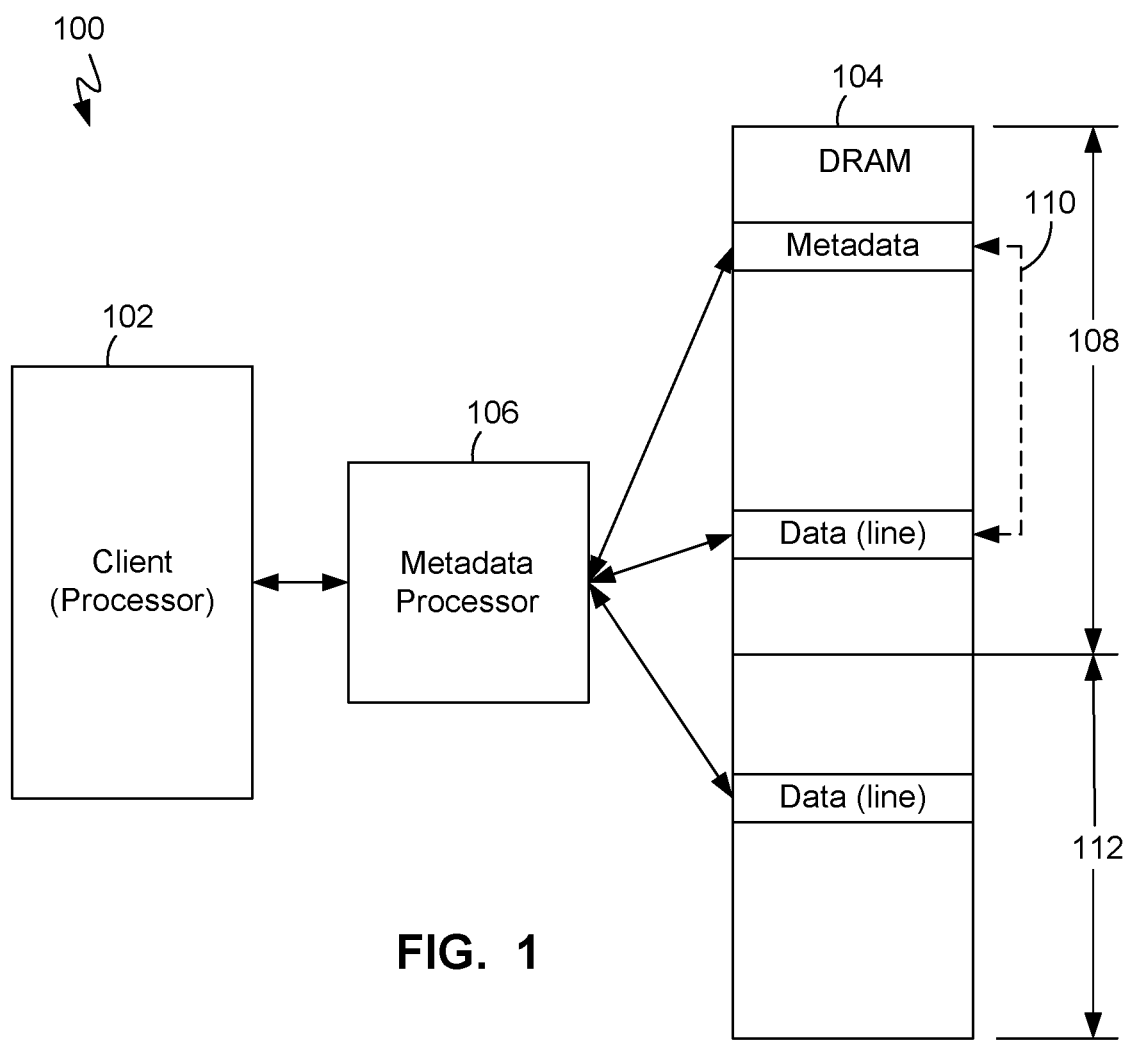
FIG. 1 is a block diagram conceptually illustrating metadata relocation in a dynamic random access memory (DRAM) in accordance with exemplary embodiments.

As illustrated in conceptual form in FIG. 1, in a system 100 a client 102 may issue memory transaction requests directed to a dynamic random access memory ("DRAM") 104. Although not shown for purposes of clarity, the system 100 may be included in any type of computing device. The client 102 also may be of any type. As understood by one of ordinary skill in the art, the client 102 may be embodied by the execution of an application, thread, etc., on a processor. The client 102 may also be referred to as a processing engine or a bus master. As understood by one of ordinary skill in the art, a bus master is any device that initiates bus transactions with a system resource, of which the DRAM 104 is an example. The DRAM 104 may be of any type, such as a double data rate synchronous DRAM ("DDR-SDRAM"), sometimes referred to for brevity as "DDR." As DDR technology has evolved, DDR versions such as fourth generation low-power DDR ("LPDDR4") and fifth generation low-power DDR ("LPDDR5") have been developed. The DRAM 104 may be, for example, LPDDR4, LPDDR5, etc.

The various memory transaction requests that the client 102 may issue may include requests to read data from the DRAM 104 and requests to write data to (i.e., store data in) the DRAM 104. The memory transaction requests may also be referred to as requests to access the DRAM 104. Each memory transaction request may include a virtual address or location. A read transaction is completed when the data that was the subject of a read transaction request has been returned to the client 102. A write transaction is completed when the data that was the subject of a write transaction request has been written to the DRAM 104.

Some types of data that may be stored in the DRAM 104 have metadata associated with the data. A metadata processor 106 may receive the memory transaction requests from the client 102 and determine whether the data that is the subject of the transaction request has associated metadata. The metadata processor 106 may determine whether the data has associated metadata based on the virtual address. For example, the metadata processor 106 may determine that the data has associated metadata if the virtual address is in a first address range and does not have associated metadata if the virtual address is in a second address range. Different address ranges may correspond to different types of metadata. Depending on whether the data has associated metadata or does not have associated metadata, and on the metadata type, the metadata processor 106 may process the data accordingly. For example, if the virtual address corresponds to data of a type that is subject to an error correction feature, the metadata processor 106 may, in the case of a write access, generate syndrome metadata to be stored in the DRAM 104 in association with the data, or in the case of a read access, may perform an error correction algorithm on the data using associated syndrome metadata read from the DRAM 104. An issue addressed by the embodiments described herein is how to efficiently access the metadata along with the data.

Data and associated metadata may be stored in a first region (i.e., an address range) 108 of the DRAM 104. The broken-line arrow 110 conceptually indicates an association between an exemplary line of data and its metadata. Data of a type that does not have any associated metadata may be stored in a second region 112 of the DRAM 104. Although only one such "first" region 108 and one such "second" region 112 are shown in FIG. 1 for purposes of example, there may be more than one region in which data and associated metadata are stored, and more than one region in which data not having any associated metadata are stored. Although not shown in FIG. 1, the virtual addresses (in a virtual domain) provided by the memory transaction requests translate or map to physical addresses (in a physical domain) in the DRAM 104.

It should be understood that data locations and metadata locations in the virtual domain are where, as sometimes colloquially stated, the client 102 "sees" or "perceives" the data and metadata being stored. As described below in further detail, from the client perspective (i.e., in the virtual domain), portions of the DRAM 104 may be configured to store data, while other portions of the DRAM 104 may be configured to store metadata. Stated another way, the virtual or client domain relates to an addressing scheme used by the client 102 to indirectly reference data and metadata storage locations in the DRAM 104. In contrast, the physical domain relates to an addressing scheme used in the DRAM 104 to physically access the storage locations in which the data and metadata may be stored. Correspondingly, it may be stated that in the physical domain, portions of the DRAM 104 may be configured to store data, while other portions of the DRAM 104 may be configured to store metadata.

Figure 2:
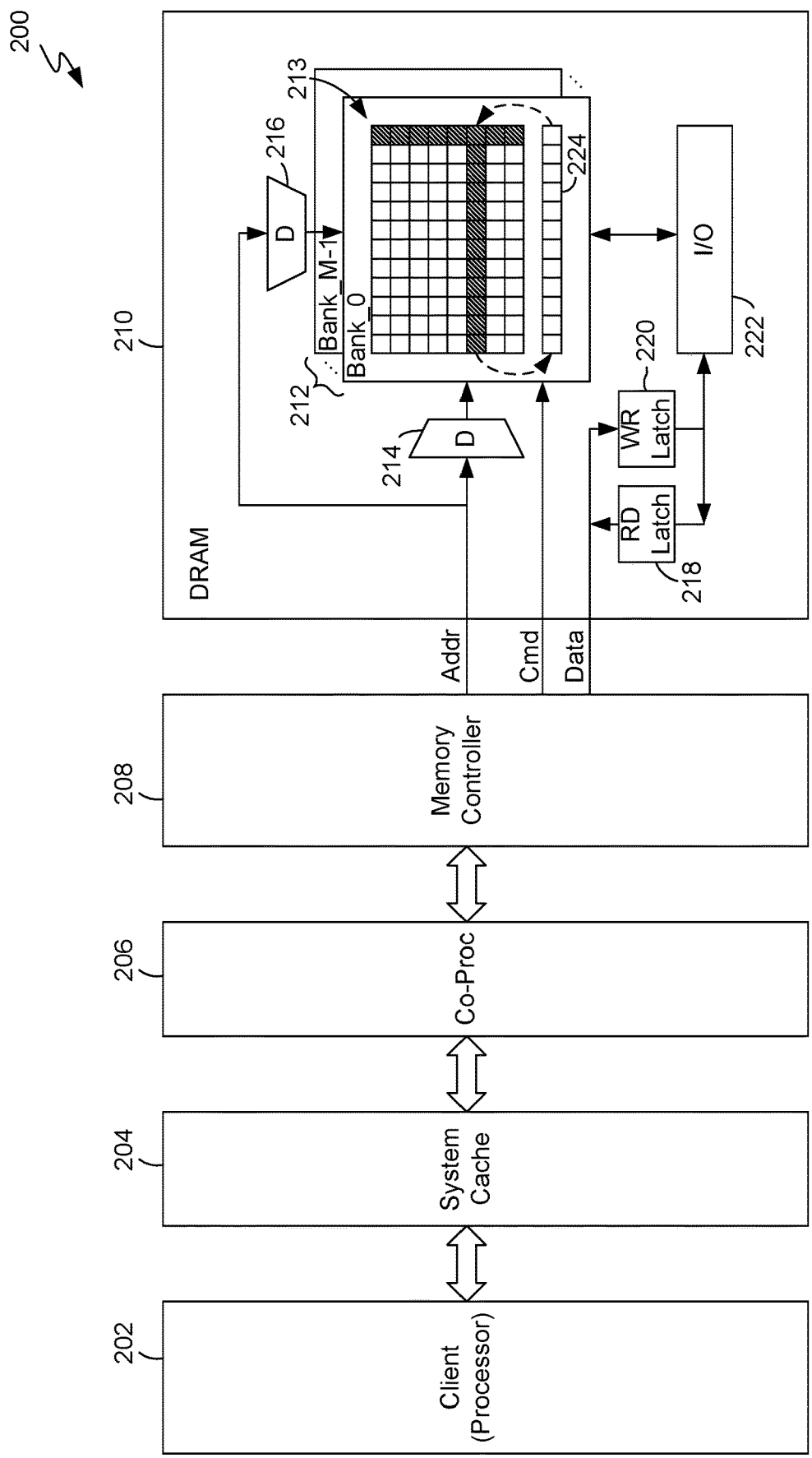
FIG. 2 is a block diagram of a system for metadata relocation in a DRAM, in accordance with exemplary embodiments.

As illustrated in FIG. 2, a system 200 may include a client 202, a system cache 204, a co-processor 206, a memory controller 208, and a DRAM 210. The system 200 may be an example of the above-described system 100 (FIG. 1). The client 202, co-processor 206, and DRAM 210 may be examples of the above-described client 102, metadata processor 106, and DRAM 104, respectively. The system cache 204 may be interposed in the data flow between the client 202 and the co-processor 206. The system cache 204 may operate in a conventional manner, as understood by one of ordinary skill in the art. Accordingly, some memory transaction requests may be completed using the system cache 204, obviating the need to access the DRAM 210. The system cache 204 may organize data in units referred to as cache lines or, for brevity, "lines." Completing memory transaction requests using the system cache 204 rather than the DRAM 210 is not directly relevant to the present disclosure. Rather, the present disclosure relates to memory transaction requests that are completed by accessing the DRAM 210. Nevertheless, it should be understood that the client 202, system cache 204, and co-processor 206 all process data in the virtual domain and therefore address data by virtual page address (i.e., a page number) and virtual line address (i.e., a line number) rather than physical address in the DRAM 210. The client 202 issues memory transaction requests that indicate virtual addresses by virtual page numbers and by line numbers within a virtual page.

The co-processor 206 may, among other functions, process metadata, such as one or more of, for example, error correction, memory tagging, DRAM authentication, DRAM freshness, DRAM compression, etc. The co-processor 206 may determine whether the client is requesting to access data of a type having associated metadata. A request to access data having associated metadata may spawn a request to also access the associated metadata. The co-processor 206 may thus provide to the memory controller 208 a request not only to access the data requested by the client 202 but also to access the associated metadata. For example, in response to a request from the client 202 to write data of a type that is subject to error correction to the DRAM 210, the co-processor 206 may generate syndrome metadata and a request to the memory controller 208 to store the syndrome metadata in the DRAM 210 in association with the data. Likewise, in response to a request to read data of a type that is subject to error correction from the DRAM 210, the co-processor 206 may generate a request to the memory controller 208 to read associated syndrome metadata from the DRAM 210. The co-processor 206 may then perform an error correction algorithm on the data using the syndrome metadata read from the DRAM 210.

The memory controller 208 may, among other functions, translate the memory transaction requests into DRAM transactions, comprising DRAM commands and physical addresses, in a conventional manner. As this conventional function of the memory controller 208 and related functions are well understood by one of ordinary skill in the art, such aspects of the memory controller 208 are not described herein.

The DRAM 210 may have a conventional structure and operate in a conventional manner. The DRAM 210 may be, for example, LPDDR4, LPDDR5, etc. Although the structure and operation of such DRAM are well understood by one of ordinary skill in the art, the following brief description is provided as background.

The DRAM 210 may comprise one or more banks 212. For example, the DRAM 210 may have M banks 212, which may be referred to as "Bank_0" through "Bank_M–1." Each bank 212 may comprise a two-dimensional array 213 of storage locations, where the storage locations in the array are accessed by selecting rows and columns. The array 213 is shown in a conceptual manner in FIG. 2 for purposes of clarity; the array 213 may have many more rows and columns than shown, and each storage location may be configured to store some amount of data, such as, for example, one byte ("B"). An exemplary row and column are highlighted (in cross-hatch) in FIG. 2. A DRAM physical address provided by the memory controller 208 thus may include a row address, a column address, and a bank address. In response to a bank address, bank address decoding logic (not shown) may select one of the banks 212. In response to a row address, a row address decoder 214 may select one of the rows in a selected bank 212. Similarly, in response to a column address, a column address decoder 216 may select one of the columns in a selected bank 212. A read latch 218 may buffer the read data, and a write latch 220 to buffer the write data. Input/output ("I/O") logic 222 may direct the read and write data from and to selected memory locations.

Each bank 212 may have a row buffer 224. The row buffer 224 stores the contents of the selected row (sometimes referred to as a physical "page"). A row must be activated or "opened" before it may be written to or read from. Once a row is opened, the DRAM 210 may read from or write to any number of columns in the row buffer 224 in response to read or write commands. Following a read or write command, the data is transferred serially between the memory controller 208 and DRAM 210 in units known as a "burst," comprising some predetermined number of columns of data. The burst size may, for example, be the same as the above-described line size. The row must be restored or "closed" after writing to or reading from the row buffer 224. Only one row in each bank 212 may remain open at a time.

The memory controller 208 may identify each transaction as a "hit," a "miss," or a "conflict" on the basis of the current state of the DRAM banks 212. A hit is a read or write transaction to a row (in a bank 212) that the memory controller 208 determines is already open at the time the memory controller 208 processes the transaction request. A hit has low latency. That is, a transaction that is a hit can be completed in a relatively short amount of time. A miss is a read or write transaction to a row (in a bank 212) that the memory controller 208 determines is closed at the time the memory controller 202 processes the transaction request. If the memory controller 208 identifies a read or write transaction as a miss, the memory controller 208 must first open the row before reading from or writing to the row. A miss has higher latency than a hit. That is, a transaction that is a miss takes more time to complete than a transaction that is a hit. A conflict is a read or write transaction to a row (in a bank 212) that the memory controller 208 determines is closed at the time the memory controller 208 processes the transaction request, while the memory controller 208 determines that another row to the same bank (to which the memory transaction is not directed) is open at that time. If the memory controller 208 identifies a read or write transaction as a conflict, the memory controller 208 must first close the open row in that bank 212, then open the row to which the transaction is directed before reading from or writing to that row. A conflict has higher latency than a miss. That is, a transaction that is a conflict takes more time to complete than a transaction that is a miss or a hit.

If data and its associated metadata are not stored in the same row in the DRAM 210, a memory access may result in a conflict and therefore in high latency. The exemplary embodiments of systems, methods, computer-readable media, etc., described herein relate to dynamically mapping or relocating the metadata in a way that maximizes the likelihood that a memory access of data and associated metadata will not result in a conflict. By storing the data and its associated metadata in the same DRAM row, the data and metadata can be accessed concurrently when the DRAM row is open, thereby avoiding a conflict.

Figure 3:
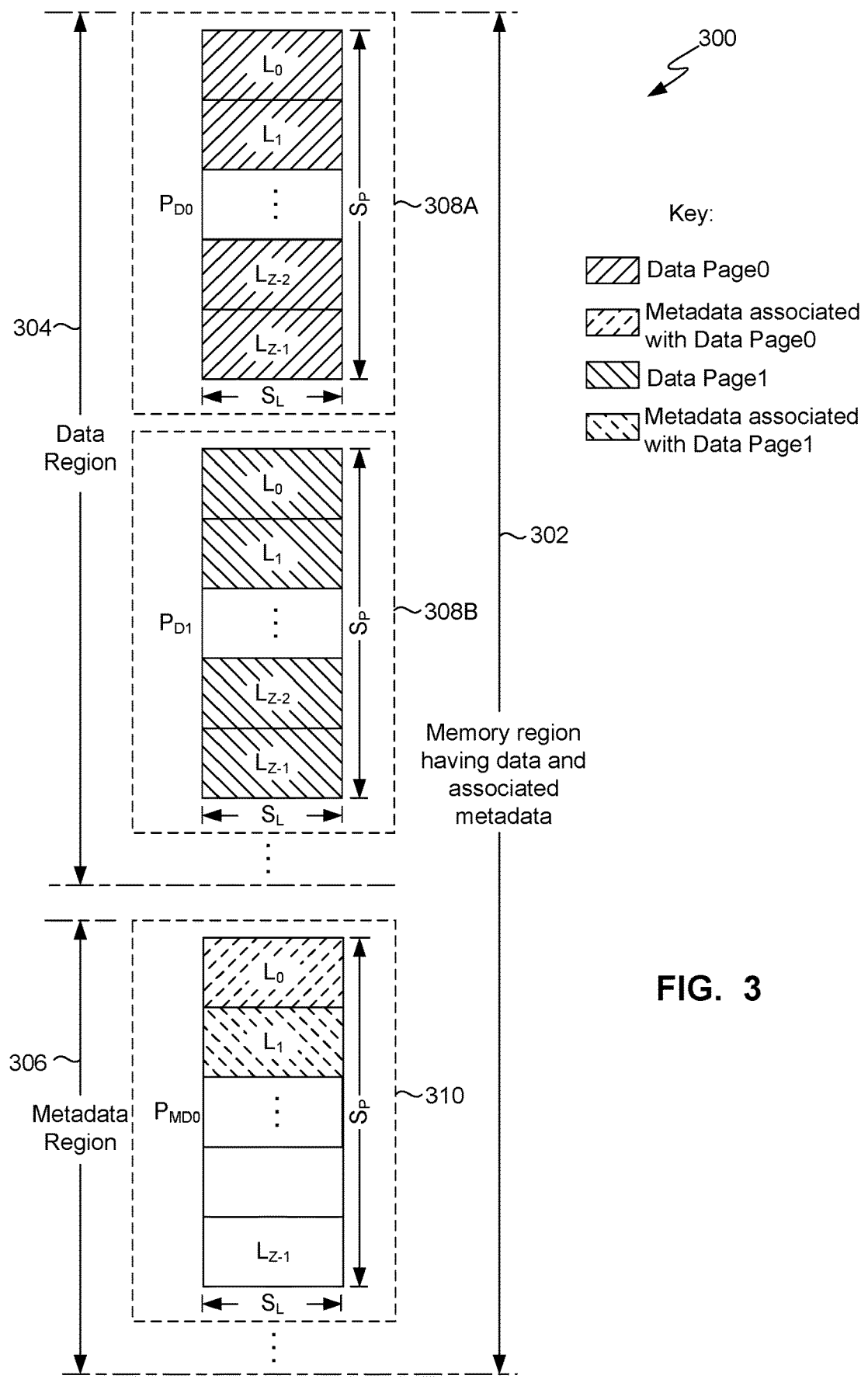
FIG. 3 is memory map diagram illustrating conventional locations of data and associated metadata in a DRAM.

As illustrated in FIG. 3, a conventional addressing scheme or configuration 300 may configure a memory address range or region 302 to include a data region 304 and a metadata region 306. That is, the region 302 is configured to store data in the data region 304 and its associated metadata in the metadata region 306. The data region 304 may be configured as two or more data pages 308A ("$P_{D0}$"), 308B ("$P_{D1}$"), etc., through a last data page (not shown). (The ellipsis symbol (" . . . ") following data page 308B indicates that there may be any number of further data pages.) Similarly, the metadata region 306 may be configured as one or more metadata pages 310.

Each of the data pages 308A, 308B, etc., may be configured as a number ("Z") of data lines: a first data line $L_0$, a second data line $L_1$, etc., through a last data line $L_{Z-1}$. Similarly, each of the one or more metadata pages 310 may be configured as Z metadata lines: a first metadata line $L_0$, a second metadata line $L_1$, etc., through a last metadata line $L_{Z-1}$. All of the metadata associated with the data stored in the first data page 308A may be stored in the first metadata line $L_0$ of the metadata page 310 ("$P_{MD0}$"). Similarly, all of the metadata associated with the data stored in the second data page 308B may be stored in the second metadata line $L_1$ of the metadata page 310. The same relative locations of data and associated metadata as described above with regard to the first two data pages 308A and 308B apply to all further data pages (not shown), and thus the metadata associated with the data stored in the last data page (not shown) may be stored in the last line $L_{Z-1}$ of the metadata page 310. Each data page 308A, 308B, etc., and each metadata page 310 may have a page size ("$S_P$") and a line size ("$S_L$"), examples of which are described below. Each of the pages in the virtual domain may be translated to (e.g., by the memory controller 208) a different DRAM row in the physical domain. Each of the lines of a page in the virtual domain may be translated to a group of one or more DRAM columns in the row corresponding to that page.

To access data and its associated metadata, a client may issue transaction requests that include virtual addresses identifying the target of the request by page number and line number. That is, the client may use a virtual domain address scheme that addresses data in the data pages 308A, 308B, etc., and addresses the associated metadata in the metadata pages 310. In the exemplary configuration 300, each of the data pages 308A, 308B, etc., and metadata pages 310 maps or translates in the physical domain to a different DRAM row. It may be appreciated from the exemplary configuration 300 that because data and its associated metadata are not stored in the same DRAM row, a memory access may result in a conflict.

Figure 4:
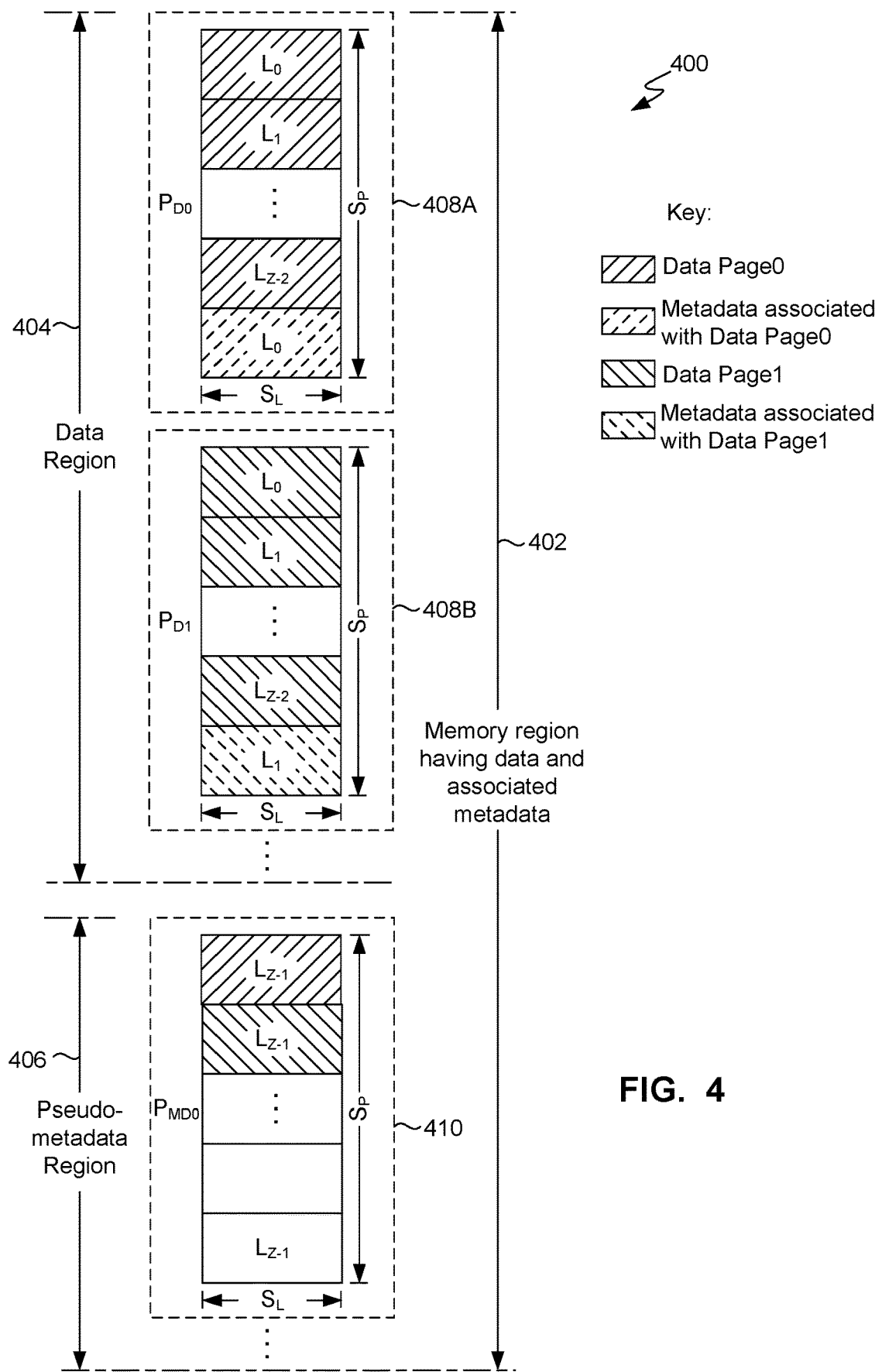
FIG. 4 is a memory map diagram illustrating relocation of metadata in a DRAM, in accordance with exemplary embodiments.

As illustrated in FIG. 4, an exemplary addressing scheme or configuration 400 may configure an address range or region 402 to include a data region 404 and a pseudo-metadata region 406. To access data and its associated metadata, a client may issue transaction requests that include virtual addresses in the region 402 identifying the target of the request by page number and line number, in the same manner described above with regard to FIG. 3. That is, the client may use a virtual domain address scheme that addresses data in the data pages 408A, 408B, etc., of the data region 404, and addresses the associated metadata in the metadata pages 410 of the pseudo-metadata region 406. In the exemplary configuration 400, each of the data pages 408A, 408B, etc., and metadata pages 410 maps or translates in the physical domain to a different DRAM row. However, in contrast with the metadata region 306 in the above-described conventional configuration 300 (FIG. 3), the pseudo-metadata region 406 is configured in the virtual (i.e., client) domain as a metadata region, but as shown in FIG. 4 is configured in the physical (i.e., memory controller and DRAM) domain as a supplemental data region, to store data that has been "relocated" from the data region 404. In other words, the client 202 "sees" or "perceives" metadata as stored in the pseudo-metadata region 406, in the same way described above with regard to FIG. 3, even though the metadata is not actually (in the physical domain) stored in DRAM rows that map to the pseudo-metadata region 406.

Instead, in the physical domain the metadata may be stored in a predetermined line, such as, for example, the last line, of each of the data pages 408A, 408B, etc., in the data region 404. In other words, the exemplary embodiments described herein operate in the physical domain as if the last line of a data page were swapped with a line of the metadata page that contains metadata for that data page in the virtual domain. For example, in the physical domain the metadata that is associated with the data stored in the first through penultimate lines (i.e., data lines $L_0$ through $L_{Z-2}$) of the first data page 408A may be stored in the last line of the first data page 408A. Similarly, in the physical domain the metadata that is associated with the data stored in the first through penultimate lines (i.e., data lines $L_0$ through $L_{Z-2}$) of the second data page 408B may be stored in the last line of the second data page 408B. The same relative locations of data and associated metadata as described above with regard to the first two data pages 408A and 408B apply to all further data pages (not shown), and thus in the physical domain the metadata that is associated with the data stored in the first through penultimate lines (i.e., data lines $L_0$ through $L_{Z-2}$) of the last data page (not shown) may be stored in the last line of that last data page.

The pseudo-metadata region 406 may be configured in the physical domain as one or more supplemental data pages 410 to store, instead of metadata, the data that in the virtual domain is stored in (i.e., the client "sees" or "perceives" as being stored in) the last line (i.e., data line $L_{Z-1}$) of each of the data pages 408A, 408B, etc. For example, the first line of the supplemental data page 410 may be configured in the physical domain to store the data associated in the virtual domain with the last line of the first data page 408A, the second line of the supplemental data page 410 may be configured to store the data associated in the virtual domain with the last line of the second data page 408B, etc.

In summary, in the virtual domain, or from the perspective of the client 202 (FIG. 2), the last line of each of the data pages 408A, 408B, etc., is configured to store data, but in the physical domain, or from the perspective of the memory controller 208 and DRAM 210 (FIG. 2), the last line of each of the data pages 408A, 408B, etc., is configured to store all the metadata associated with that one of the pages 408A, 408B, etc. Further, in the virtual domain, or from the perspective of the client 202 (FIG. 2), the pseudo-metadata region 406 is configured to store the metadata associated with the data pages 408A, 408B, etc., but in the physical domain, or from the perspective of the memory controller 208 and DRAM 210, the pseudo-metadata region 406 is configured to store the data that, from the perspective of the client 202 (FIG. 2), is stored in the last line of each of the data pages 408A, 408B, etc. Stated another way, the last line of each of the data pages 408A, 408B, etc., is a virtual domain data location while at the same time being a physical domain metadata location configured to store all the metadata associated with that one of the data pages 408A, 408B, etc. Further, each line of the supplemental data page 410 (in the pseudo-metadata region 406) is a virtual domain metadata location while at the same time being a physical domain data location corresponding to the last line of each of the data pages 408A, 408B, etc. It should be understood that the last line is an example of a predetermined line in which the metadata may be stored, and in other embodiments the metadata may be stored in any other predetermined line. For example, in another embodiment (not shown) the first line could be the line that is configured to store metadata. In still another embodiment (not shown) the second line could be the line that is configured to store metadata, etc.

Figure 5:
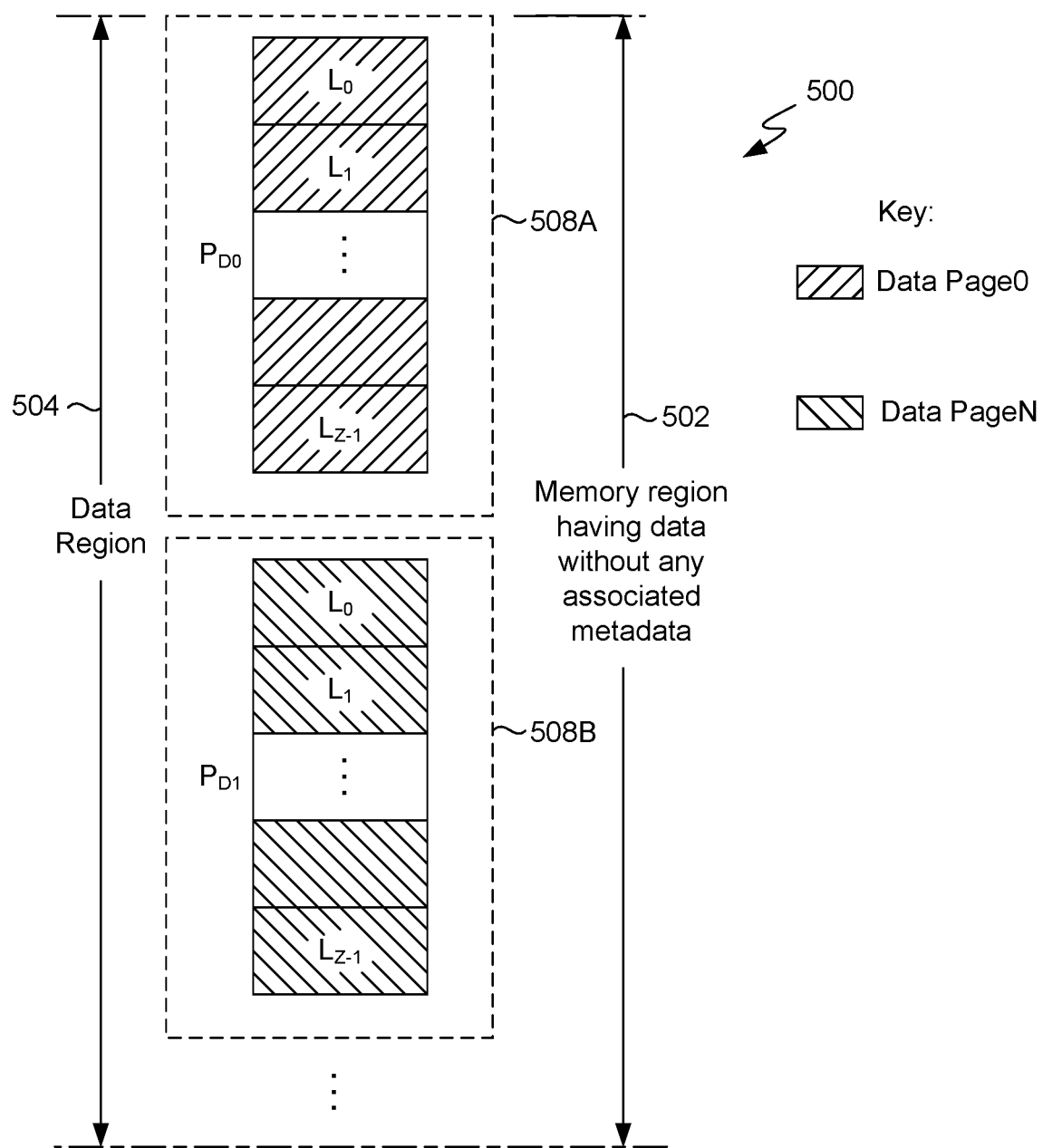
FIG. 5 is a memory map diagram illustrating locations of data having no associated metadata, in accordance with exemplary embodiments.

As illustrated in FIG. 5, it may be noted that the above-described addressing scheme or configuration 400 (FIG. 4), which relates or maps data and metadata locations, may co-exist with an addressing scheme or configuration 500 that pertains to data not having any associated metadata. The configuration 500 may configure an address range or region 502 of the DRAM 210 to consist of only a data region 504 and no associated metadata region. The address ranges or regions 502 and 402 (FIG. 4) may be two address ranges or regions of the same DRAM 210 (FIG. 2). The data region 504 may be configured as two or more DRAM data pages 508A, 508B, etc.

Figure 6:
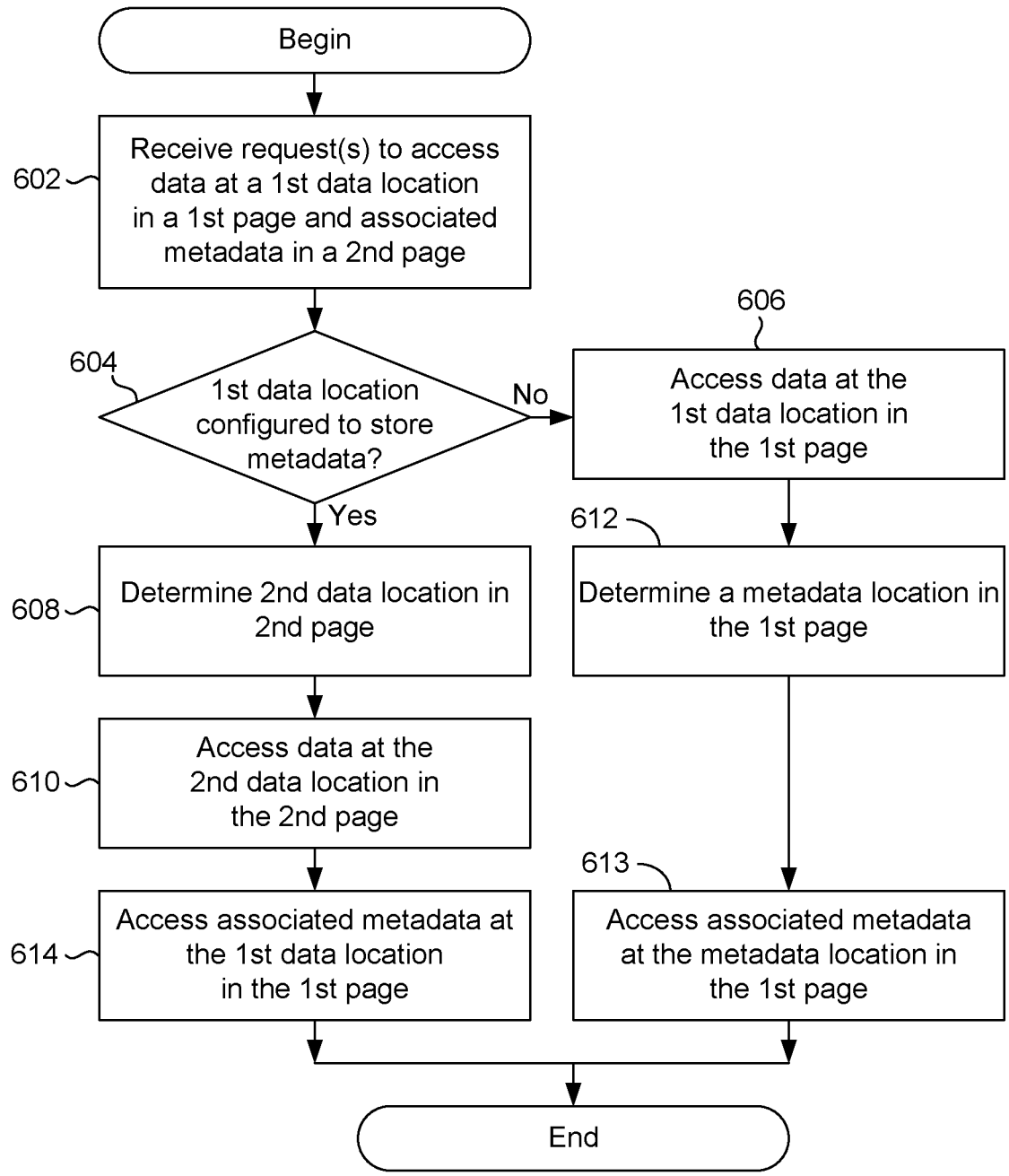
FIG. 6 is a flow diagram illustrating a method for metadata relocation in a DRAM, in accordance with exemplary embodiments.

As illustrated in FIG. 6, an exemplary method 600 for metadata relocation in a DRAM system may include events or actions described below with regard to blocks 602-614. The method 600 reflects that the mapping or relocation of data and metadata described above with regard to FIG. 4 may occur dynamically, i.e., in response to memory transaction requests from the client 202 (FIG. 2). The method 600 may be performed or otherwise controlled by, for example, the above-described co-processor 206, or by the co-processor 206 and the memory controller 208 in combination. The co-processor 206, the memory controller 208, or the co-processor 206 and the memory controller 208 in combination may be an example of a means for performing functions described below with regard to the method 600. In the following description of the method 600, the terms "first," "second," etc., may be used to distinguish elements or steps and not to describe or imply any order, sequence, ranking, etc. For example, references in the method 600 to "first" and "second" pages are not limited to the respective data pages 408A and 408B described above with regard to FIG. 4 or any other pages that may be consecutive, but rather may refer to any two of the data pages 408A, 408B, etc., or any other two pages. Similarly, references to "first" and "second" data locations are not limited to the respective lines $L_0$ and $L_1$ or any other data locations that may be consecutive, but rather may refer to any two locations.

As indicated by block 602, the method 600 may include receiving a request to access data at a first data location in a first page and associated metadata at a first metadata location in a second page. The request may comprise two access requests: one to access the data and another to access the metadata associated with that data. The access requests may be received by, for example, a portion of the co-processor 206.

As indicated by block 604, it may be determined whether the first data location in the first page is configured to store metadata. For example, as described above with regard to FIG. 4, the last line of each of the data pages 408A, 408B, etc., may be configured to store metadata. Therefore, in an exemplary embodiment in which the last line of each data page is configured to store metadata rather than data, it may be determined (block 604) whether the first data location is the last line of a data page. That is, it may be determined whether the target of the data access request is the last line of a data page. It should be understood that in the exemplary embodiment described herein, the co-processor 206 is configured to use the mapping or configuration 400 described above with regard to FIG. 4, and therefore can determine whether a particular physical domain data location is configured to store metadata (rather than data) or is configured to store data (rather than metadata). That is, in the exemplary embodiment the co-processor 206 can determine whether the target of a data access request is the last line of a data page. A first data location that is configured to store metadata may also be referred to as a second metadata location.

As indicated by block 606, if it is determined (block 604) that the first data location in the first page is not configured to store metadata, then the data at the first data location in the first page may be accessed. For example, the memory controller 208 (FIG. 2) may access the data by issuing commands to the DRAM 210, communicating the data with the DRAM 210, etc., as described above with regard to FIG. 2. Referring again to the mapping or configuration 400 described above with regard to FIG. 4, if the first data location corresponds to one of the first through penultimate lines (i.e., data lines $L_0$ through $L_{Z-2}$) of one of the data pages 408A, 408B, etc., then that physical domain data location may be accessed.

As indicated by block 612, if it is determined (block 604) that the first data location in the first page is not configured to store metadata, then a ("second") metadata location in the first page may be determined. Referring again to the example described above with regard to FIG. 4, each line of the supplemental data page 410 of the pseudo-metadata region 406 is mapped to the last line of one of the data pages 408A, 408B, etc. Therefore, in this example the "second" metadata location in the first page is the last line of the first page. For example, if the first page is the data page 408A, then the second metadata location may be determined to be the last line of the data page 408A. Similarly, if the first page is the data page 408B, then the second metadata location may be determined to be the last line of the data page 408B. The second metadata location is the location of metadata that has been "relocated" from the pseudo-metadata region 406. As indicated by block 613, after a ("second") metadata location in the first page has been determined (block 612), the associated metadata may be accessed at that metadata location in the first page.

Accessing a data location in accordance with block 606 may include translating (e.g., by the memory controller 208) a virtual domain data location into a physical domain data location. The request to access data may provide the first data location in the form of a virtual page number and line number. Likewise, the request to access metadata may provide the first metadata location in the form of a virtual page number and line number. The page number in the virtual domain may correspond to, and therefore be translated to (e.g., by the memory controller 208), a DRAM row in the physical domain. The line number in the virtual domain may correspond to, and therefore be translated to, a group of one or more DRAM columns in that row. (The number of DRAM columns per data line may be predetermined, i.e., a constant throughout operation of the embodiment.)

As indicated by block 608, if it is determined (block 604) that the first data location in the first page is configured to store metadata, then a second data location in a second page may be determined based on the first data location. Referring again to the mapping or configuration example described above with regard to FIG. 4, if it is determined that the requested or target data location is the last line (i.e., data line $L_{Z-1}$) of one of the data pages 408A, 408B, etc., then it may be determined which line of the supplemental data page 410 in the pseudo-metadata region 406 corresponds to that data page. In this example, the supplemental data page 410 is the above-referenced "second" page, and the line in the supplemental data page 410 is the "second" data location.

As indicated by block 610, once a second data location in the second page has been determined (block 608), that second data location may be accessed. In the case of a read access, accessing the data at the second data location may include the memory controller 208 (FIG. 2) reading the data from the DRAM 210. In the case of a write access, accessing the data may include the memory controller 208 ensuring that the data has been written to, i.e., stored in, the DRAM 210.

As indicated by block 614, if it is determined (block 604) that the first data location in the first page is configured to store metadata, the associated metadata may then be accessed at that first data location. Accessing the associated metadata may include translating (e.g., by the memory controller 208) the first data location in the virtual domain into the physical domain. The page number in the virtual domain may correspond to, and therefore be translated to, a DRAM row in the physical domain. The line number in the virtual domain may correspond to, and therefore be translated to, a group of one or more DRAM columns in that row.

Note that in the event the first data location in the first page is configured to store data (i.e., is not configured to store metadata), then the first data location is in the same DRAM row as the metadata location. With reference to the exemplary mapping in FIG. 4, in the event the target data location is any of the data lines $L_0$ through $L_{Z-2}$ of the data page 408A, which in the physical domain corresponds to a first DRAM row, then the memory controller 208 (FIG. 2) does not encounter a conflict because the target metadata location is in that same first DRAM row. Likewise, in the event the target data location is any of the data lines $L_0$ through $L_{Z-2}$ of the data page 408B, which in the physical domain corresponds to a second DRAM row, then the memory controller 208 (FIG. 2) does not encounter a conflict because the target metadata location is in that same second DRAM row. However, in the event the first data location in the first page is configured to store metadata (i.e., the first data location has been configured as a second metadata location), then the second data location (where the target data has been relocated) will not be in the same DRAM row as the second metadata location. With reference again to the exemplary mapping in FIG. 4, in the event the translated or relocated data location is in the supplemental DRAM data page 410, then the memory controller 208 encounters a conflict because the translated or relocated metadata location is the last line of one of the data pages 408A, 408B, etc. A conflict is less likely than a hit (i.e., no-conflict) because in each DRAM page only one line (e.g., the last line) out of Z lines is relocated to the supplemental DRAM data page 410. On average, a conflict may occur only one out of every Z requests to access data and associated metadata.

Note that the above-described method 600 (FIG. 6) relates to a request to access data having associated metadata. Although not shown in FIG. 6, if a request to access data that does not have any associated metadata is received, a data location in yet another memory page, such as the above-described page 508A or 508B (FIG. 5), may be determined and accessed in a conventional manner. That is, the method 600 may be conditionally performed, depending on whether the requested data is of a type that has associated metadata or another type that does not have associated metadata.

Figure 7:
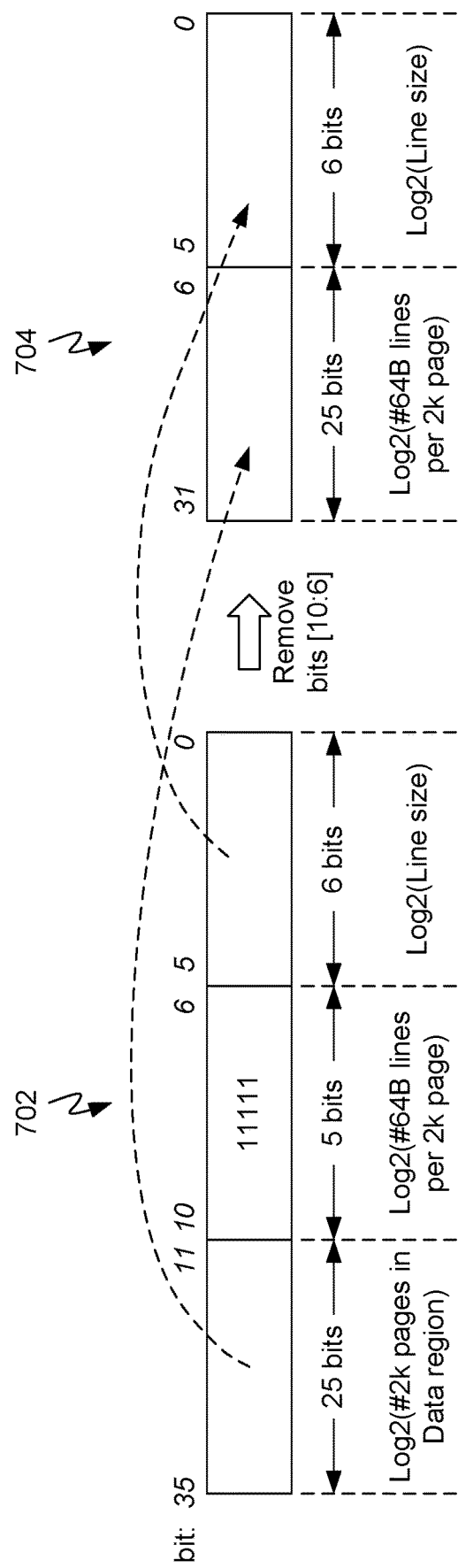
FIG. 7 is an address diagram illustrating an example of translating a data address in the relocation method of FIG. 6, in accordance with exemplary embodiments.

With reference to FIG. 7, an example of the determination in block 608 of the method 600 (FIG. 6) may be described. That is, FIG. 7 illustrates an example of translation of an address 702 in the data region 404 (FIG. 4) to an address in the pseudo-metadata region 406. In this example, the DRAM page size $S_P$ is 2 kB, and the line size $S_L$ is 64 B. In this example, the size of the data region 402 (FIG. 4) may be 32 GB, comprising 16 k of the aforementioned 2 kB pages, and the size of the metadata region 404 may be 1 GB. That is, the ratio of data to metadata for the type of data to which the example pertains is 32:1.

In this example, the addresses are 36 bits in length. The address bits may be referred to by their position number, from a least-significant bit ("LSB") in position "0" or, for brevity, "bit 0," to a most-significant bit ("MSB") in position "35" or, for brevity, "bit 35." The address may be organized in bit groups. The size or number of bits in the lowest-order bit group is six because the size of this bit group is the base-2 logarithm ("log 2") of the line size $S_L$ (FIG. 4). The size or number of bits in the bit group is five because the size of this bit group is log 2 of the number of lines per page, which in this example is the number of 64 B lines per 2 kB page. The size or number of bits in the next bit group is 25 because the size of this bit group is log 2 of the data region size of 32 GB.

Figure 8:
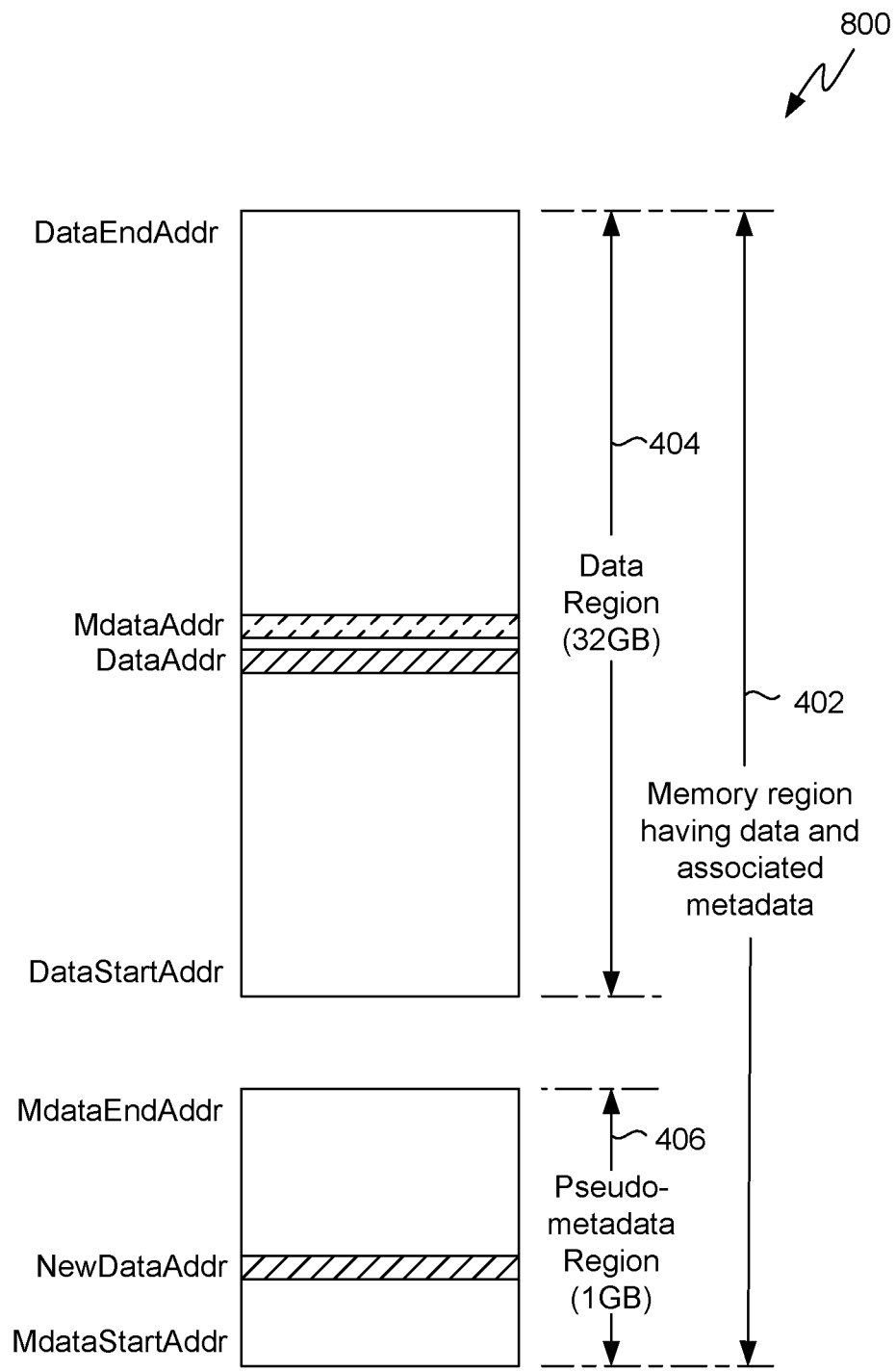
FIG. 8 is a memory map diagram illustrating aspects of the translation of FIG. 7.

In FIG. 8, translation of an address in the data region 404 (FIG. 4) of the memory region 402 to a physical address in the pseudo-metadata region 406 of the memory region 402 is illustrated. The memory region 402 may be characterized by a data region starting address ("DataStartAddr") and data region ending address ("DataEndAddr") of the data region 404, and a metadata region starting address ("MdataStartAddr") and metadata region ending address ("MdataEndAddr") in the metadata region 406. The "DataAddr" is the address of the 64B line in one of the data pages 408A, 408B, etc. (not individually shown in FIG. 8) corresponding to the requested virtual domain data location. Although not shown in FIG. 8, the address of the last line of the data page 408A, 408B, etc., may be referred to as "LastLineDataAddr." In the equations below, an arrow symbol "→" may be used to indicate that a result (i.e., the right side of the equation) is obtained from the left side of the equation. In some equations, the arrow may imply an operation.

In this example, a determination in accordance with block 604 (FIG. 6) may be performed by determining whether bits 6 through 10 of the data address are all ones, i.e., whether DataAddr[10:6]='11111'. If bits 6 through 10 of the data address are '11111" then the line corresponding to the requested or target data location is the last line of one of the data pages 408A, 408B, etc. If bits 6 through 10 of the data address are '11111" then the requested address in the data region 404 (FIG. 4) may be translated to an address in the pseudo-metadata region 406.

Continuing this example, a determination in accordance with block 608 (FIG. 6) may be performed by first determining an address offset of the last line from the starting address ("LastLineDataAddrOffset"). The address offset may be determined by subtracting the data region starting address from LastLineDataAddr:

LastDataLineAddr−DataStartAddr→LastLineDataAddrOffset (Eq. 1)

The address offset of the last line within the data page may be determined from the LastLineDataAddrOffset:

LastLineDataAddrOffset→DataPageAddrOffset (Eq.2)

In Equation 2 above, the arrow symbol ("→") implies an operation by which address bits 6 through 10 (i.e., the line offset within a page) are discarded. The result, LastLineDataAddrOffset is the offset address of the data line that needs to be added to the pseudo-metadata region starting address, MdataStartAddr. Then, the address of the relocated data line ("NewDataAddr") in the pseudo-metadata region 406 may be determined by adding the address offset of the last line within the data page to the metadata region starting address:

DataPageAddrOffset+MdataStartAddr→NewDataAddr (Eq. 3)

Figure 9:
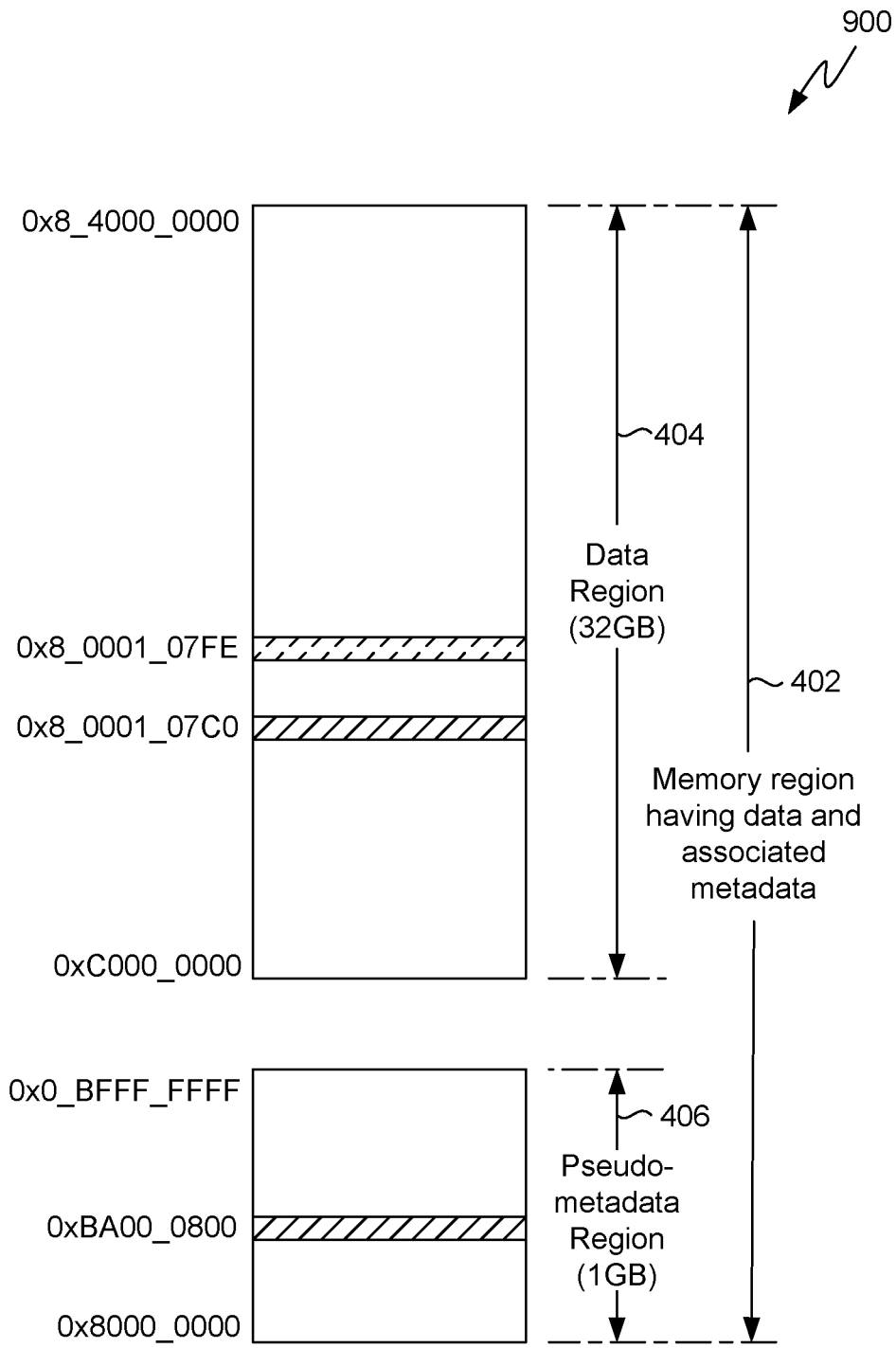
FIG. 9 is similar to FIG. 8, showing examples of actual memory addresses.

In FIG. 9, examples of address values in the memory region 402 are shown. Because the value of DataAddr[10:6] is '11111', then Equation 1 is evaluated: 0x8_000107C0-0xc000_0000→0x7_4001_07C0. Equation 2 evaluates to: 0x7_4001_07C0→0x3A00_0800. Equation 3 evaluates to: 0x3A00_0800+0x8000_0000→0xBA00_0800. Thus the address of the relocated data line (NewDataAddr) in the pseudo-metadata region 406 in this example is 0xBA00_0800.

Figure 10:
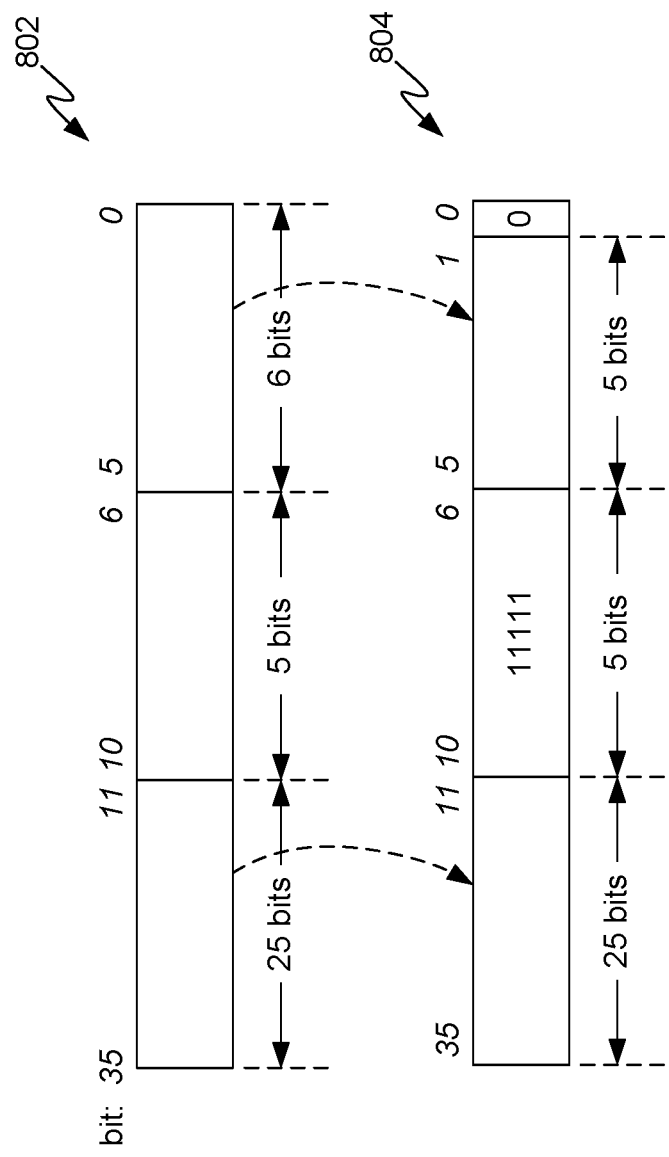
FIG. 10 is an address diagram illustrating an example translating a metadata address in the relocation method of FIG. 6, in accordance with exemplary embodiments.

With reference to FIG. 10, an example of the determination in block 612 of the method 600 (FIG. 6) may be described. That is, FIG. 10 illustrates an example of translation of an address 802 in the pseudo-metadata region 406 to an address 804 in the data region 404. As the DataAddr, which is the requested or target data location, is the last line of one of the data pages 408A, 408B, etc., in this example, the determinations in block 612 (FIG. 6) may be performed as indicated in FIG. 10 and Equation 4:

DataAddr→LastLineDataAddrOffset(MdataAddr) (Eqn. 4)

In Equation 4 above, the arrow symbol ("→") implies an operation by which address bits 6 through 10 are forced to '11111'. Using the values from the example described above with regard to FIG. 9, the address of the associated metadata in the data region 404 (MdataAddr) would be 0x8_0001_07FE.

Figure 11:
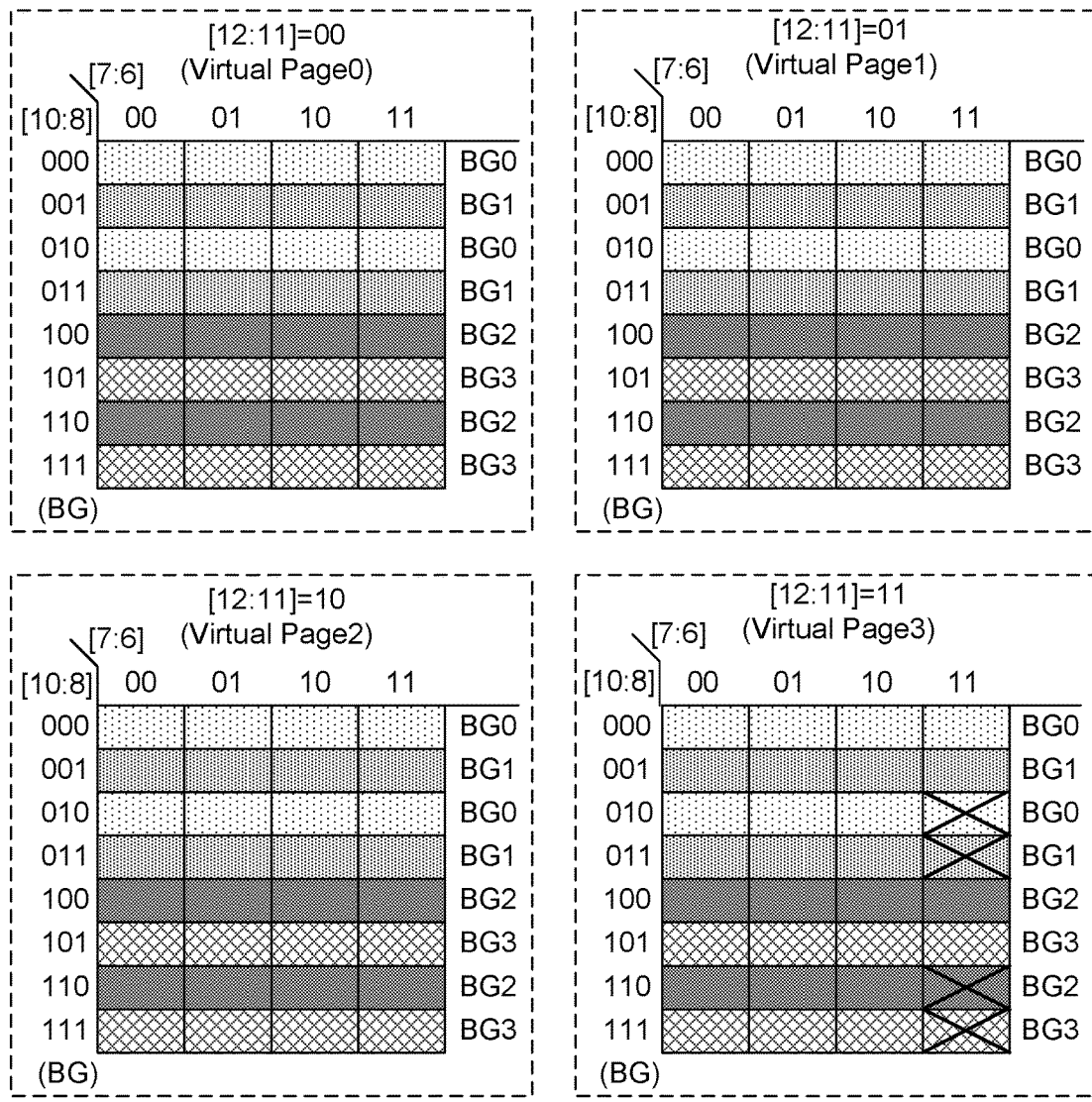
FIG. 11 is a memory map diagram illustrating relocation of metadata in a DRAM, in accordance with exemplary embodiments in which the DRAM comprises multiple bank groups.

The above-described method 600 (FIG. 6) may also apply to embodiments in which the DRAM 210 (FIG. 2) is organized in multiple bank groups ("BG"s) among which the data is interleaved, such as LPDDR5 configured in "bank group mode" (also referred to as "bank group mask"). As illustrated in FIG. 11, an exemplary memory region 1100 (e.g., in the DRAM 210) may be organized in the virtual domain as a group of four virtual pages, referred to in FIG. 11 as: "Virtual Page0," "Virtual Page1," "Virtual Page2" and "Virtual Page3." Similarly to the previous embodiment described above (e.g., with regard to FIG. 4), in which the DRAM 210 is not organized in multiple BGs, in this embodiment data may be addressed in the virtual domain by virtual page number and line number (not shown). For example, the client 202 (FIG. 2) may request to access data by indicating one of Virtual Page0-Virtual Page3 and a line number within that virtual page.

In the LPDDR5 addressing scheme, bits 14-13 address the bank, bits [10:8] address the BG and bits [5:0] address the starting column in the DRAM array (not shown in FIG. 11). In the illustrated example, the DRAM may be configured in four BGs, referred to in FIG. 11 as: "BG0," "BG1," "BG2" and "BG3." Each bank group may comprise four banks. Each of the virtual pages may be organized in lines, represented in FIG. 11 by shaded blocks. The different types of shading distinguish the bank groups from each other, as set forth in the Key in FIG. 11. Each virtual page and each line may have a size of, for example, 2 kB and 64 B, respectively, as in the previous embodiment described above (e.g., with regard to FIG. 4). Note that the four virtual pages, Virtual Page0-Virtual Page3 are virtual or client domain memory regions, while the BGs and banks are physical or DRAM domain structures.

Similar to the previous embodiment, each line of data has associated metadata. A virtual metadata page (not shown)

may be configured (i.e., in the virtual domain) to store the associated metadata. A request to access data and associated metadata may therefore address data in one of Virtual Page0-Virtual Page3 and address metadata in a virtual metadata page.

The LPDDR5 bank group mode interleaves the banks, which may be referred to as "B0," "B1, "B2" and "B3," across the bank groups. Note in FIG. 11 that each virtual page column represents a 64 B access, addressed by bits [7:6]. The pattern in which bank interleaving occurs, i.e., the pattern in which successive accesses move from one bank to another across the BGs, is not indicated in FIG. 11 and may be any pattern, as understood by one of ordinary skill in the art. The issue of where to map or relocate the metadata presents a challenge because the interleaving does not align with the page size. For example, in an LPDDR5 bank group mode embodiment, in which the virtual pages are 2 kB in size, the bank groups are not interleaved at the same size boundary (e.g., 2 kB) as the virtual pages. The issue of where to map or relocate the metadata represents a challenge because even if the metadata is relocated to the last line in the virtual data page (similar to LPDDR5) there is no guarantee that the data and the metadata will be placed in the same physical bank group page in the DDR. When the banks groups are interleaved at a boundary smaller than the page size, a single virtual page will be mapped to different physical pages in different Bank groups.

This challenge may be addressed by configuring one line of each bank group (i.e., in the physical domain) to store the metadata (see Key in FIG. 11). Note in the example shown in FIG. 11 that the last line of bank B3 in each of bank groups BG0, BG1, BG2 and BG3 is configured to store metadata.

Figure 12:
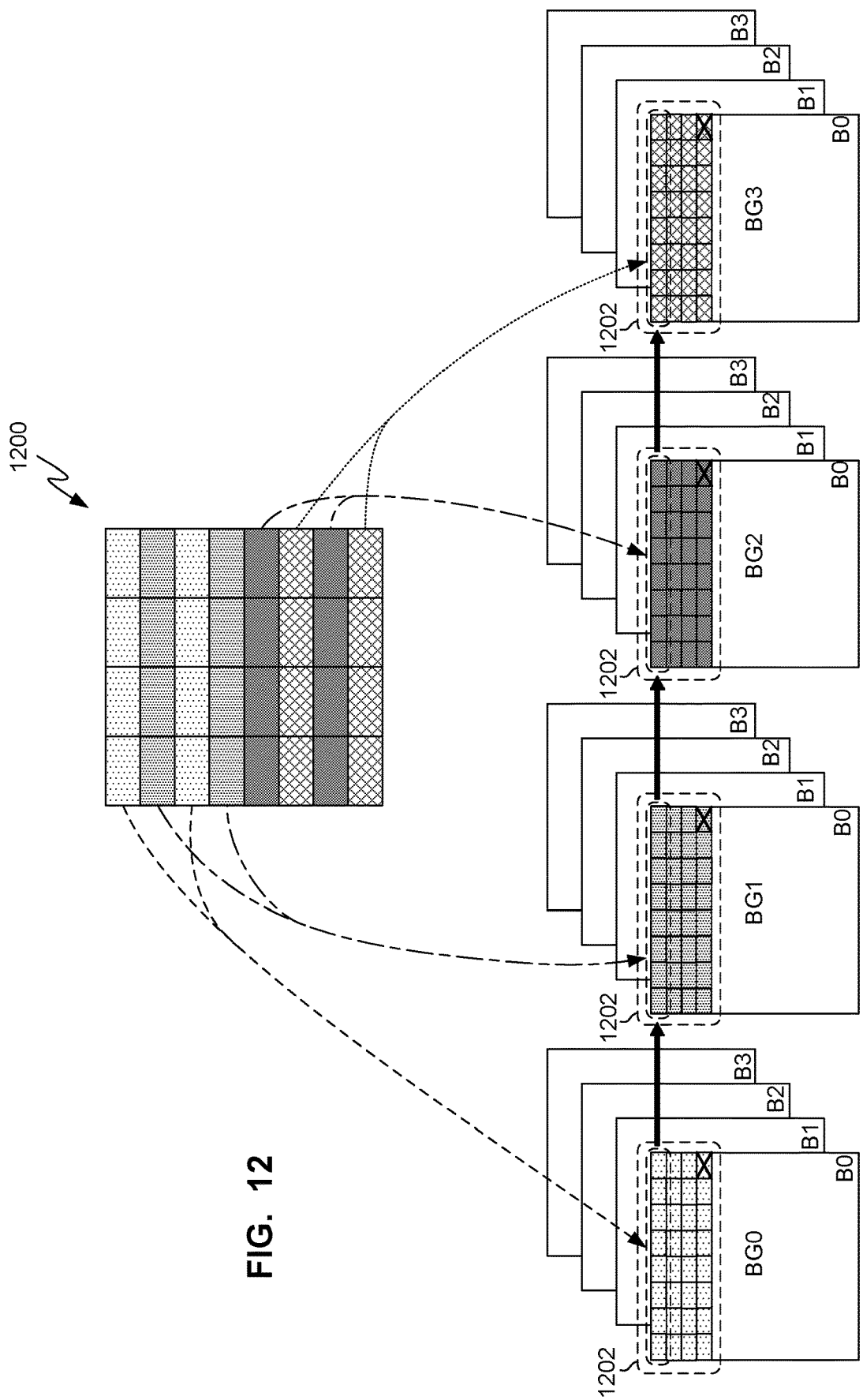
FIG. 12 is another memory map diagram illustrating relocation of metadata in a DRAM, in accordance with exemplary embodiments in which the DRAM comprises multiple bank groups.

In FIG. 12, the above-described mapping (FIG. 11) is depicted in an alternative way. In FIG. 12, an exemplary mapping between a virtual page 1200, such as any of the above-described Virtual Page0-Virtual Page3, and the physical or DRAM storage locations, is indicated by the broken-line arrows. Each mapped bank group portion 1202 has a storage structure similar to that of the DRAM 210 described above with regard to FIG. 2. That is, each of banks B0-B3 comprises an array of storage locations addressed by row and column. In each row of the array, a group of some predetermined number of storage locations or columns may correspond to a line (e.g., 64 B) in the virtual domain.

The shaded blocks within bank groups BG0-BG3 represent the mapping of all four virtual pages Virtual Page0-Virtual Page3 to the physical (DRAM) domain. As a result of bank group interleaving, in each of bank groups BG0-BG3 a portion of each of virtual pages Virtual Page0-Virtual Page3 maps to a portion of one of banks B0-B3, such as, for example, the circled portions 1202 of bank B0. Significantly, note that all of the metadata lines (see Key in FIG. 11) map to the same DRAM page, depicted in FIG. 12 for purposes of clarity as the fourth row from the top in bank B0 of each of bank groups BG0-BG3. Nevertheless, in other examples, the metadata lines could map to any DRAM page.

In the example illustrated in FIGS. 11-12, a client's request to access data in any line in the virtual page 1200 other than the last line of bank B3 in the same bank group as the requested data would not result in a conflict, and therefore no relocation of the requested data address is performed. Note that although only one page in each of banks B0-B3 in a bank group may be open at a time, pages may be open in different banks at the same time. For example, the page containing the metadata line (e.g., the four rows constitute a physical page of bank B3 in FIG. 12) may be open while a page containing a requested data line in B0, B1 or B2 is also open. In the illustrated example, only a data access request directed to the last line of bank B3 will result in a conflict, because that line is configured in the physical domain to store metadata rather than data. If it is determined that a data access request is directed to the last line of bank B3, relocation of the requested data address is performed. As there are 32 lines in each physical page for any bank in the illustrated example, the probability of data access request being a conflict is one in 32. With the data to metadata ratio of 1/32 (as shown in the example in FIG. 11), 31 out of a total of 32 accesses to a DRAM physical page have the metadata located in the same physical page within a Bank group. Any metadata access following the data access for those 31 lines will not result in a page conflict as the metadata access will result in a page hit. The data access to the last line of the page is relocated to a line in the pseudo metadata page (maps to a different DRAM page) resulting in a page miss/conflict. Hence, the page conflict probability is 1/32.

A determination in accordance with block 604 (FIG. 6) may be performed by first determining an address ("DataAddrSwapped") having bank group mask bits (Addr [10:8]) swapped with lower-order page bits (Addr[12:11]). If bits 6 through 10 of DataAddrSwapped are '11111" then the line corresponding to the requested or target data location is the last line of one of the pages Virtual Page0-Virtual Page3. If bits 6 through 10 of the data address are '11111" then the determination in accordance with block 608 (FIG. 6) may be performed by translating the requested data address to the last line of the last bank group (see Eq. 1 above). The address offset of the last line within the page may be determined from the LastLineDataAddrOffset (see Eq. 2 above). Then, the address of the relocated data line (NewDataAddr) may be determined by adding the address offset of the last line within the data page to the metadata region starting address (see Eq. 3 above).

Using the same exemplary address value shown in FIG. 9 of 0x8_0001_07C0, because the value of DataAddr[10:6] is not '11111' after swapping the bank group bits with the lower-order page bits, it may be determined that the data address is not the last line of a bank group page. Therefore, no data address relocation is performed. The metadata address may be determined by swapping the bank group mask bits (Addr[10:8]) with the lower-order page bits (Addr [12:11]) to form DataAddrSwapped. Then, the metadata address may be determined (see Eq. 4). Using the value for DataAddr of 0x8_001_07C0, the relocated address of the associated metadata (MdataAddr) would be 0x8_0001_1FD6.

In another example, the address value may be 0x0_F000_FFC0. Because the value of DataAddr[10:6] is '11111' after swapping the bank group bits with the lower-order page bits, it may be determined that the data address is the last line of a bank group page. A determination in accordance with block 612 (FIG. 6) may be performed by first determining the address offset of the last line from the starting address. The address offset may be determined by subtracting the data region starting address from LastLineDataAddr (see Eq. 1 above). Then, the address offset of the last line within the page may be determined (see Eq. 2 above). The address of the relocated data line ("NewDataAddr") may be determined by adding the address offset of the last line within the data page to the metadata region starting address (see Eq. 3 above). In this example, in which the address value is 0x0_F000_FFC0, Eq. 1 evaluates to: 0x0_F000_FFC0-0xC000_0000→0x3000_FFC0. Equation 2 evaluates to: 0x3000_FFC0→0x180_07C0. Equation 3 evaluates to: 0x3000_FFC0+ 0x8000_0000→0x8180_FFC0. Thus the address of the relocated data line is 0x8180_FFC0.

The relocated metadata address may be determined by swapping the bank group mask bits (Addr[10:8]) with the lower-order page bits (Addr[12:11]) to form DataAddrSwapped. Then, the metadata address may be determined (see Eq. 4). Using the value for DataAddr of 0x0_F000_FFC0, the relocated address of the associated metadata (MdataAddr) would be 0xF000_FFFE.

Figure 13:
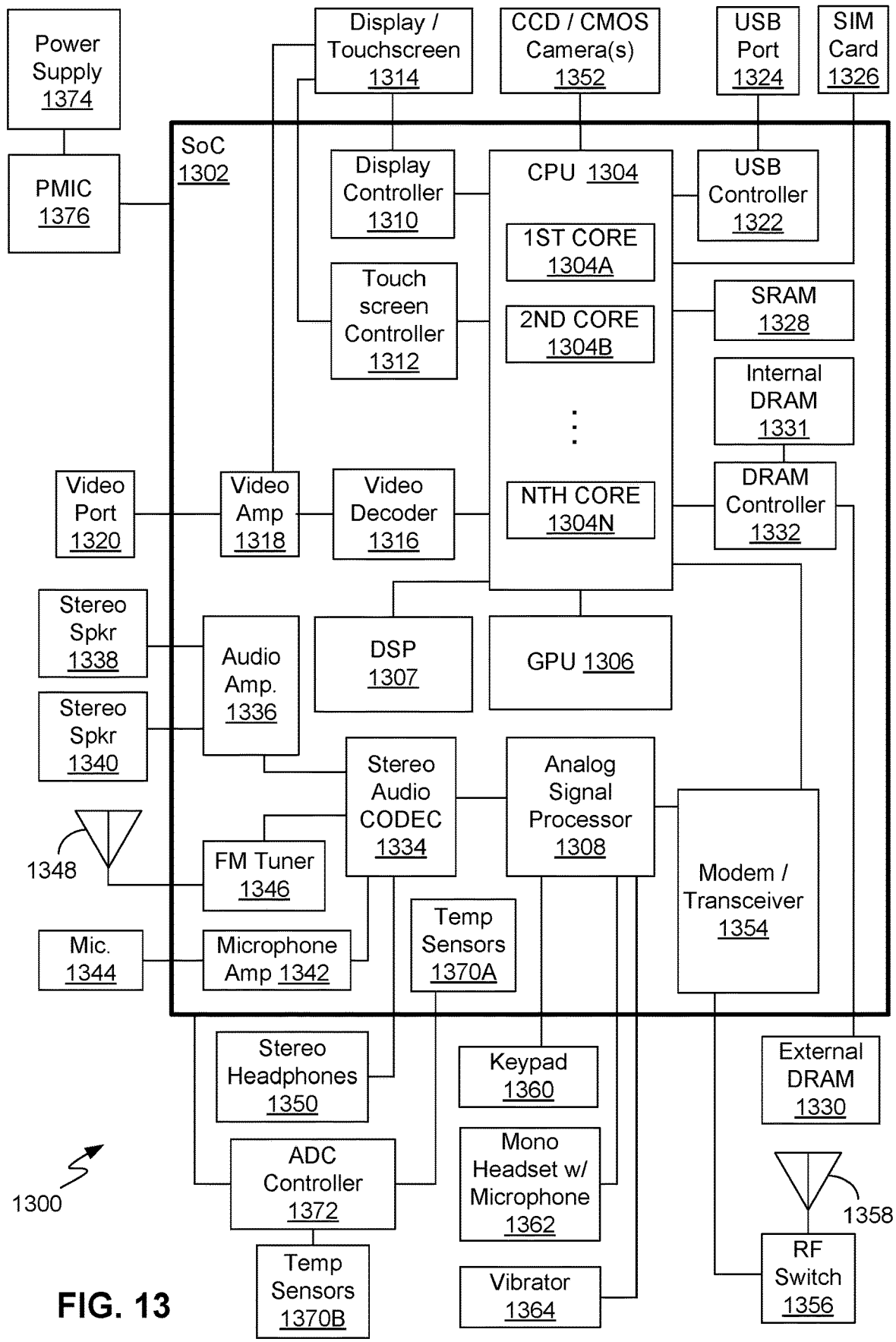
FIG. 13 is a block diagram of a computing device, in accordance with exemplary embodiments.

As illustrated in FIG. 13, exemplary embodiments of systems and methods for metadata relocation in a DRAM system may be provided in a portable computing device ("PCD") 1300. The PCD 1300 may be an example of the above-described system 100 (FIG. 1) or 200 (FIG. 2).

The PCD 1300 may include an SoC 1302. The SoC 1302 may include a CPU 1304, a GPU 1306, a DSP 1307, an analog signal processor 1308, or other processors. The CPU 1304 may include multiple cores, such as a first core 1304A, a second core 1304B, etc., through an Nth core 1304N.

A display controller 1310 and a touch-screen controller 1312 may be coupled to the CPU 1304. A touchscreen display 1314 external to the SoC 1302 may be coupled to the display controller 1310 and the touch-screen controller 1312. The PCD 1300 may further include a video decoder 1316 coupled to the CPU 1304. A video amplifier 1318 may be coupled to the video decoder 1316 and the touchscreen display 1314. A video port 1320 may be coupled to the video amplifier 1318. A universal serial bus ("USB") controller 1322 may also be coupled to CPU 1304, and a USB port 1324 may be coupled to the USB controller 1322. A subscriber identity module ("SIM") card 1326 may also be coupled to the CPU 1304.

One or more memories may be coupled to the CPU 1304. The one or more memories may include both volatile and non-volatile memories. Examples of volatile memories include static random access memory ("SRAM") 1328 and dynamic RAMs ("DRAM"s) 1330 and 1331. Such memories may be external to the SoC 1302, such as the DRAM 1330, or internal to the SoC 1302, such as the DRAM 1331. A DRAM controller 1332 coupled to the CPU 1304 may control the writing of data to, and reading of data from, the DRAMs 1330 and 1331. In other embodiments, such a DRAM controller may be included within a processor, such as the CPU 1304. The DRAM controller 1332 may be an example of the memory controller 208 (FIG. 2) or the memory controller 208 in combination with the co-processor 206. Either of the DRAMs 1330 and 1331 may be an example of the DRAM 210 (FIG. 2).

A stereo audio CODEC 1334 may be coupled to the analog signal processor 1308. Further, an audio amplifier 1336 may be coupled to the stereo audio CODEC 1334. First and second stereo speakers 1338 and 1340, respectively, may be coupled to the audio amplifier 1336. In addition, a microphone amplifier 1342 may be coupled to the stereo audio CODEC 1334, and a microphone 1344 may be coupled to the microphone amplifier 1342. A frequency modulation ("FM") radio tuner 1346 may be coupled to the stereo audio CODEC 1334. An FM antenna 1348 may be coupled to the FM radio tuner 1346. Further, stereo headphones 1350 may be coupled to the stereo audio CODEC 1334. Other devices that may be coupled to the CPU 1304 include one or more digital (e.g., CCD or CMOS) cameras 1352.

A modem or RF transceiver 1354 may be coupled to the analog signal processor 1308. An RF switch 1356 may be coupled to the RF transceiver 1354 and an RF antenna 1358. In addition, a keypad 1360, a mono headset with a microphone 1362, and a vibrator device 1364 may be coupled to the analog signal processor 1308.

The SoC 1302 may have one or more internal or on-chip thermal sensors 1370A and may be coupled to one or more external or off-chip thermal sensors 1370B. An analog-to-digital converter ("ADC") controller 1372 may convert voltage drops produced by the thermal sensors 1370A and 1370B to digital signals. A power supply 1374 and a power management integrated circuit ("PMIC") 1376 may supply power to the SoC 1302.

Firmware or software may be stored in any of the above-described memories, such as DRAM 1330 or 1331, SRAM 1328, etc., or may be stored in a local memory directly accessible by the processor hardware on which the software or firmware executes. Execution of such firmware or software may control aspects of any of the above-described methods or configure aspects any of the above-described systems. Any such memory or other non-transitory storage medium having firmware or software stored therein in computer-readable form for execution by processor hardware may be an example of a "computer-readable medium," as the term is understood in the patent lexicon.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

Implementation examples are described in the following numbered clauses:

1. A method for metadata relocation in a dynamic random access memory (DRAM), comprising:

receiving a first request to access first data at a first data location in a first memory page of the DRAM and associated metadata in a second memory page of the DRAM;

determining whether the first data location in the first memory page is configured to store metadata;

accessing the first data at the first data location in the first memory page if the first data location in the first memory page is not configured to store metadata;

determining a metadata location in the first memory page if the first data location in the first memory page is not configured to store metadata;

accessing the associated metadata at the metadata location in the first memory page if the first data location in the first memory page is not configured to store metadata;

determining a second data location in the second memory page if the first data location in the first memory page is configured to store metadata;

accessing the first data at the second data location in the second memory page if the first data location in the first memory page is configured to store metadata; and accessing the associated metadata at the first data location in the first memory page if the first data location in the first memory page is configured to store metadata.

2. The method of clause 1, wherein accessing the associated metadata at the metadata location in the first memory page occurs concurrently with accessing the first data at the first data location in the first memory page if the first data location in the first memory page is not configured to store metadata.

3. The method of clause 2, wherein:
accessing the associated metadata at the metadata location in the first memory page comprises accessing a DRAM row; and
accessing the first data at the first data location in the first memory page comprises accessing the DRAM row.

4. The method of clause 1, further comprising:
receiving a second request to access second data at a second data location in a third memory page, the second data having no associated metadata; and
accessing the second data at the second data location in the third memory page.

5. The method of clause 1, wherein determining whether the first data location in the first memory page is configured to store metadata comprises determining whether the first data location is a last line in the first memory page.

6. The method of clause 1, wherein accessing the first data at the first data location in the first memory page comprises accessing a last line of a plurality of lines in the first memory page.

7. The method of clause 1, wherein accessing the associated metadata at the metadata location in the first memory page comprises accessing a last line of a plurality of lines in the first memory page, the last line comprising metadata associated with data in all other lines in the first memory page.

8. The method of clause 1, wherein the memory has two or more bank groups, each bank group comprising two or more banks, and the metadata location in the first memory page is a last line of a last bank in each bank group.

9. A system for metadata relocation, comprising:
a dynamic random access memory (DRAM); and
a processor configured to:
receive a first request to access first data at a first data location in a first memory page and associated metadata in a second memory page;
determine whether the first data location in the first memory page is configured to store metadata;
access the first data at the first data location in the first memory page if the first data location in the first memory page is not configured to store metadata;
determine a metadata location in the first memory page if the first data location in the first memory page is not configured to store metadata;
access the associated metadata at the metadata location in the first memory page if the first data location in the first memory page is not configured to store metadata;
determine a second data location in the second memory page if the first data location in the first memory page is configured to store metadata;
access the first data at the second data location in the second memory page if the first data location in the first memory page is configured to store metadata; and
access the associated metadata at the first data location in the first memory page if the first data location in the first memory page is configured to store metadata.

10. The system of clause 9, wherein the processor is configured to access the associated metadata at the metadata location in the first memory page concurrently with accessing the first data at the first data location in the first memory page if the first data location in the first memory page is not configured to store metadata.

11. The system of clause 10, wherein:
the processor is configured to access the associated metadata at the metadata location in the first memory page by accessing a DRAM row; and
the processor is configured to access the first data at the first data location in the first memory page by accessing the DRAM row.

12. The system of clause 9, wherein the processor is further configured to:
receive a second request to access second data at a second data location in a third memory page, the second data having no associated metadata; and
access the second data at the second data location in the third memory page.

13. The system of clause 9, wherein the processor is configured to determine whether the first data location in the first memory page is configured to store metadata by determining whether the first data location is a last line in the first memory page.

14. The system of clause 9, wherein the processor is configured to access the first data at the first data location in the first memory page by accessing a last line of a plurality of lines in the first memory page.

15. The system of clause 9, wherein the processor is configured to access the associated metadata at the metadata location in the first memory page by accessing a last line of a plurality of lines in the first memory page, the last line comprising metadata associated with data in all other lines in the first memory page.

16. The system of clause 9, wherein the memory has two or more bank groups, each bank group comprising two or more banks, and the metadata location in the first memory page is a last line of a last bank in each bank group.

17. A system for metadata relocation in a dynamic random access memory (DRAM), comprising:
means for receiving a first request to access first data at a first data location in a first memory page of the DRAM and associated metadata in a second memory page of the DRAM;
means for determining whether the first data location in the first memory page is configured to store metadata;
means for accessing the first data at the first data location in the first memory page if the first data location in the first memory page is not configured to store metadata;
means for determining a metadata location in the first memory page if the first data location in the first memory page is not configured to store metadata;
means for accessing the associated metadata at the metadata location in the first memory page if the first data location in the first memory page is not configured to store metadata;
means for determining a second data location in the second memory page if the first data location in the first memory page is configured to store metadata;
means for accessing the first data at the second data location in the second memory page if the first data location in the first memory page is configured to store metadata; and
means for accessing the associated metadata at the first data location in the first memory page if the first data location in the first memory page is configured to store metadata.

18. The system of clause 17, wherein the means for accessing the associated metadata at the metadata location in the first memory page comprises means for accessing the associated metadata concurrently with accessing the first data at the first data location in the first memory page if the first data location in the first memory page is not configured to store metadata.

19. The system of clause 18, wherein:
the means for accessing the associated metadata at the metadata location in the first memory page comprises means for accessing a DRAM row; and
the means for accessing the first data at the first data location in the first memory page comprises means for accessing the DRAM row.

20. The system of clause 17, further comprising:
means for receiving a second request to access second data at a second data location in a third memory page, the second data having no associated metadata; and
means for accessing the second data at the second data location in the third memory page.

21. The system of clause 17, wherein the means for determining whether the first data location in the first memory page is configured to store metadata comprises means for determining whether the first data location is a last line in the first memory page.

22. The system of clause 17, wherein the means for accessing the first data at the first data location in the first memory page comprises means for accessing a last line of a plurality of lines in the first memory page.

23. The system of clause 17, wherein the means for accessing the associated metadata at the metadata location in the first memory page comprises means for accessing a last line of a plurality of lines in the first memory page, the last line comprising metadata associated with data in all other lines in the first memory page.

24. The system of clause 17, wherein the memory has two or more bank groups, each bank group comprising two or more banks, and the metadata location in the first memory page is a last line of a last bank in each bank group.

25. A computer-readable medium for metadata relocation in a dynamic random access memory (DRAM), comprising a non-transitory computer-readable medium having stored thereon in computer-executable form instructions that, when executed by a processor, configure the processor to:
receive a first request to access first data at a first data location in a first memory page and associated metadata in a second memory page;
determine whether the first data location in the first memory page is configured to store metadata;
access the first data at the first data location in the first memory page if the first data location in the first memory page is not configured to store metadata;
determine a metadata location in the first memory page if the first data location in the first memory page is not configured to store metadata;
access the associated metadata at the metadata location in the first memory page if the first data location in the first memory page is not configured to store metadata;
determine a second data location in the second memory page if the first data location in the first memory page is configured to store metadata;
access the first data at the second data location in the second memory page if the first data location in the first memory page is configured to store metadata; and
access the associated metadata at the first data location in the first memory page if the first data location in the first memory page is configured to store metadata.

26. The computer-readable medium of clause 25, wherein the instructions configure the processor to access the associated metadata at the metadata location in the first memory page concurrently with accessing the first data at the first data location in the first memory page if the first data location in the first memory page is not configured to store metadata.

27. The computer-readable medium of clause 26, wherein the instructions configure the processor to:
access the associated metadata at the metadata location in the first memory page by accessing a DRAM row; and
access the first data at the first data location in the first memory page by accessing the DRAM row.

28. The computer-readable medium of clause 25, wherein the instructions further configure the processor to:
receive a second request to access second data at a second data location in a third memory page, the second data having no associated metadata; and
access the second data at the second data location in the third memory page.

29. The computer-readable medium of clause 25, wherein the instructions configure the processor to determine whether the first data location in the first memory page is configured to store metadata by determining whether the first data location is a last line in the first memory page.

30. The computer-readable medium of clause 25, wherein the instructions configure the processor to access the first data at the first data location in the first memory page by accessing a last line of a plurality of lines in the first memory page.

What is claimed is:
1. A method for metadata relocation in a dynamic random access memory (DRAM), comprising:
receiving a first request to access first data at a first data location in a first memory page of the DRAM and associated metadata in a second memory page of the DRAM;
determining whether the first data location in the first memory page is configured to store metadata;
accessing the first data at the first data location in the first memory page if the first data location in the first memory page is not configured to store metadata;
determining a metadata location in the first memory page if the first data location in the first memory page is not configured to store metadata;
accessing the associated metadata at the metadata location in the first memory page if the first data location in the first memory page is not configured to store metadata;
determining a second data location in the second memory page if the first data location in the first memory page is configured to store metadata;
accessing the first data at the second data location in the second memory page if the first data location in the first memory page is configured to store metadata; and
accessing the associated metadata at the first data location in the first memory page if the first data location in the first memory page is configured to store metadata.

2. The method of claim 1, wherein accessing the associated metadata at the metadata location in the first memory page occurs concurrently with accessing the first data at the first data location in the first memory page if the first data location in the first memory page is not configured to store metadata.

3. The method of claim 2, wherein:
accessing the associated metadata at the metadata location in the first memory page comprises accessing a DRAM row; and
accessing the first data at the first data location in the first memory page comprises accessing the DRAM row.

4. The method of claim 1, further comprising:
receiving a second request to access second data at a second data location in a third memory page, the second data having no associated metadata; and accessing the second data at the second data location in the third memory page.

5. The method of claim 1, wherein determining whether the first data location in the first memory page is configured to store metadata comprises determining whether the first data location is a last line in the first memory page.

6. The method of claim 1, wherein accessing the first data at the first data location in the first memory page comprises accessing a last line of a plurality of lines in the first memory page.

7. The method of claim 1, wherein accessing the associated metadata at the metadata location in the first memory page comprises accessing a last line of a plurality of lines in the first memory page, the last line comprising metadata associated with data in all other lines in the first memory page.

8. The method of claim 1, wherein the memory has two or more bank groups, each bank group comprising two or more banks, and the metadata location in the first memory page is a last line of a last bank in each bank group.

9. A system for metadata relocation, comprising:
a dynamic random access memory (DRAM); and
a processor configured to:
receive a first request to access first data at a first data location in a first memory page and associated metadata in a second memory page;
determine whether the first data location in the first memory page is configured to store metadata;
access the first data at the first data location in the first memory page if the first data location in the first memory page is not configured to store metadata;
determine a metadata location in the first memory page if the first data location in the first memory page is not configured to store metadata;
access the associated metadata at the metadata location in the first memory page if the first data location in the first memory page is not configured to store metadata;
determine a second data location in the second memory page if the first data location in the first memory page is configured to store metadata;
access the first data at the second data location in the second memory page if the first data location in the first memory page is configured to store metadata; and
access the associated metadata at the first data location in the first memory page if the first data location in the first memory page is configured to store metadata.

10. The system of claim 9, wherein the processor is configured to access the associated metadata at the metadata location in the first memory page concurrently with accessing the first data at the first data location in the first memory page if the first data location in the first memory page is not configured to store metadata.

11. The system of claim 10, wherein:
the processor is configured to access the associated metadata at the metadata location in the first memory page by accessing a DRAM row; and
the processor is configured to access the first data at the first data location in the first memory page by accessing the DRAM row.

12. The system of claim 9, wherein the processor is further configured to:
receive a second request to access second data at a second data location in a third memory page, the second data having no associated metadata; and
access the second data at the second data location in the third memory page.

13. The system of claim 9, wherein the processor is configured to determine whether the first data location in the first memory page is configured to store metadata by determining whether the first data location is a last line in the first memory page.

14. The system of claim 9, wherein the processor is configured to access the first data at the first data location in the first memory page by accessing a last line of a plurality of lines in the first memory page.

15. The system of claim 9, wherein the processor is configured to access the associated metadata at the metadata location in the first memory page by accessing a last line of a plurality of lines in the first memory page, the last line comprising metadata associated with data in all other lines in the first memory page.

16. The system of claim 9, wherein the memory has two or more bank groups, each bank group comprising two or more banks, and the metadata location in the first memory page is a last line of a last bank in each bank group.

17. A system for metadata relocation in a dynamic random access memory (DRAM), comprising:
means for receiving a first request to access first data at a first data location in a first memory page of the DRAM and associated metadata in a second memory page of the DRAM;
means for determining whether the first data location in the first memory page is configured to store metadata;
means for accessing the first data at the first data location in the first memory page if the first data location in the first memory page is not configured to store metadata;
means for determining a metadata location in the first memory page if the first data location in the first memory page is not configured to store metadata;
means for accessing the associated metadata at the metadata location in the first memory page if the first data location in the first memory page is not configured to store metadata;
means for determining a second data location in the second memory page if the first data location in the first memory page is configured to store metadata;
means for accessing the first data at the second data location in the second memory page if the first data location in the first memory page is configured to store metadata; and
means for accessing the associated metadata at the first data location in the first memory page if the first data location in the first memory page is configured to store metadata.

18. The system of claim 17, wherein the means for accessing the associated metadata at the metadata location in the first memory page comprises means for accessing the associated metadata concurrently with accessing the first data at the first data location in the first memory page if the first data location in the first memory page is not configured to store metadata.

19. The system of claim 18, wherein:
the means for accessing the associated metadata at the metadata location in the first memory page comprises means for accessing a DRAM row; and
the means for accessing the first data at the first data location in the first memory page comprises means for accessing the DRAM row.

20. The system of claim 17, further comprising:
means for receiving a second request to access second data at a second data location in a third memory page, the second data having no associated metadata; and means for accessing the second data at the second data location in the third memory page.

21. The system of claim 17, wherein the means for determining whether the first data location in the first memory page is configured to store metadata comprises means for determining whether the first data location is a last line in the first memory page.

22. The system of claim 17, wherein the means for accessing the first data at the first data location in the first memory page comprises means for accessing a last line of a plurality of lines in the first memory page.

23. The system of claim 17, wherein the means for accessing the associated metadata at the metadata location in the first memory page comprises means for accessing a last line of a plurality of lines in the first memory page, the last line comprising metadata associated with data in all other lines in the first memory page.

24. The system of claim 17, wherein the memory has two or more bank groups, each bank group comprising two or more banks, and the metadata location in the first memory page is a last line of a last bank in each bank group.

25. A computer-readable medium for metadata relocation in a dynamic random access memory (DRAM), comprising a non-transitory computer-readable medium having stored thereon in computer-executable form instructions that, when executed by a processor, configure the processor to:
receive a first request to access first data at a first data location in a first memory page and associated metadata in a second memory page;
determine whether the first data location in the first memory page is configured to store metadata;
access the first data at the first data location in the first memory page if the first data location in the first memory page is not configured to store metadata;
determine a metadata location in the first memory page if the first data location in the first memory page is not configured to store metadata;
access the associated metadata at the metadata location in the first memory page if the first data location in the first memory page is not configured to store metadata;
determine a second data location in the second memory page if the first data location in the first memory page is configured to store metadata;
access the first data at the second data location in the second memory page if the first data location in the first memory page is configured to store metadata; and
access the associated metadata at the first data location in the first memory page if the first data location in the first memory page is configured to store metadata.

26. The computer-readable medium of claim 25, wherein the instructions configure the processor to access the associated metadata at the metadata location in the first memory page concurrently with accessing the first data at the first data location in the first memory page if the first data location in the first memory page is not configured to store metadata.

27. The computer-readable medium of claim 26, wherein the instructions configure the processor to:
access the associated metadata at the metadata location in the first memory page by accessing a DRAM row; and
access the first data at the first data location in the first memory page by accessing the DRAM row.

28. The computer-readable medium of claim 25, wherein the instructions further configure the processor to:
receive a second request to access second data at a second data location in a third memory page, the second data having no associated metadata; and
access the second data at the second data location in the third memory page.

29. The computer-readable medium of claim 25, wherein the instructions configure the processor to determine whether the first data location in the first memory page is configured to store metadata by determining whether the first data location is a last line in the first memory page.

30. The computer-readable medium of claim 25, wherein the instructions configure the processor to access the first data at the first data location in the first memory page by accessing a last line of a plurality of lines in the first memory page.

* * * * *